(12) United States Patent
Matsumoto

(10) Patent No.: US 7,528,966 B2
(45) Date of Patent: May 5, 2009

(54) POSITION DETECTION APPARATUS AND EXPOSURE APPARATUS

(75) Inventor: Takahiro Matsumoto, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/965,868

(22) Filed: Dec. 28, 2007

(65) Prior Publication Data

US 2008/0165368 A1    Jul. 10, 2008

(30) Foreign Application Priority Data

Jan. 10, 2007    (JP)    ............... 2007-002877

(51) Int. Cl.
G01B 11/14    (2006.01)
(52) U.S. Cl. ..................... 356/614; 356/624
(58) Field of Classification Search ... 356/237.1–241.6, 356/426–431, 600–640
See application file for complete search history.

(56) References Cited

U.S. PATENT DOCUMENTS

| | | | |
|---|---|---|---|
| 4,068,955 A * | 1/1978 | Bodlaj ..................... 356/631 |
| 4,643,569 A * | 2/1987 | Sullivan et al. ........... 356/237.1 |
| 4,823,014 A * | 4/1989 | Miyawaki .............. 250/559.31 |
| 5,124,562 A * | 6/1992 | Kawashima et al. ........ 250/548 |
| 5,325,176 A * | 6/1994 | Suda et al. ................. 356/509 |
| 5,602,400 A * | 2/1997 | Kawashima ................ 250/548 |
| 2004/0207848 A1* | 10/2004 | Dang ......................... 356/399 |

FOREIGN PATENT DOCUMENTS

| | | |
|---|---|---|
| JP | 05-257058 | 10/1993 |
| JP | 10-070068 | 3/1998 |
| JP | 11-016827 | 1/1999 |

\* cited by examiner

*Primary Examiner*—L. G Lauchman
*Assistant Examiner*—Jarreas C Underwood
(74) *Attorney, Agent, or Firm*—Locke Lord Bissell & Liddell LLP

(57) ABSTRACT

The position detection apparatus includes a light projecting optical system which has an optical axis, and which cause two light beams symmetrical about the optical axis to enter a substrate, a light receiving optical system which receives the two light beams which have emerged from the light projecting optical system and are reflected by the substrate, a light receiving unit which is arranged at a position shifted in the optical axis direction, a detection unit which respectively detects the positions of the two light beams which have entered the light receiving unit, and a calculator which calculates the surface position of the substrate in the normal direction based on the positions of the two light beams, which are detected by the detection unit. At least one of the light projecting optical system and the light receiving optical system is shared for the two light beams.

10 Claims, 21 Drawing Sheets

POSITION DETECTION APPARATUS AND EXPOSURE APPARATUS

BACKGROUND OF THE INVENTION

1. Field of the Invention

The present invention relates to a position detection apparatus and an exposure apparatus.

2. Description of the Related Art

Background arts of a position detection apparatus and exposure apparatus will be explained by taking a semiconductor exposure apparatus which requires a strict measurement of the surface position as an example.

Photolithography (exposure) is often used to manufacture a micropatterned semiconductor device such as a semiconductor memory or logic circuit or a liquid crystal display device on a substrate. In this case, an exposure apparatus (e.g., a projection exposure apparatus) is used to project and transfer a circuit pattern drawn on a mask (e.g., a reticle) onto a substrate (e.g., a wafer) via a projection optical system.

Along with an increase in the degree of integration of semiconductor devices, the exposure apparatus is required to project and transfer the circuit pattern of a mask onto a substrate by exposure with a higher resolving power. A minimum dimension (resolution) with which the exposure apparatus can transfer is proportional to the wavelength of exposure light and is inversely proportional to the numerical aperture (NA) of the projection optical system.

That is, the shorter the wavelength, the better the resolving power. In view of this, the recent light sources often use a KrF excimer laser (wavelength: about 248 nm) and an ArF excimer laser (wavelength: about 193 nm) which have wavelengths shorter than those of superhigh pressure mercury lamps (the g-line (wavelength: about 436 nm) and the i-line (wavelength: about 365 nm)).

The higher the numerical aperture (NA), the better the resolving power. In view of this, a study for the practical application of immersion exposure is also in progress.

Another demand has arisen for further widening the exposure region. To meet this demand, there is available an exposure region widening technique of forming an exposure region having a rectangular slit shape (exposure slit region), and relatively scanning a mask and substrate at high speed. An exposure apparatus (also called a "scanner") of a step-and-scan scheme using this technique can expose a wide area with a higher accuracy than with an exposure apparatus (also called a "stepper") of a step-and-repeat scheme which reduces a roughly square exposure region and performs cell projection for it.

During exposure, this scanner causes a focus detection system to irradiate the exposure region on the substrate with measurement light to measure the surface position of the substrate in the optical axis direction of the projection optical system. Based on the detection result obtained by the focus detection system, the scanner exposes the substrate while aligning its position in the optical axis direction with the imaging plane of the pattern of the mask.

Along with the shortening of exposure light and an increase in the NA of a projection optical system, the depth of focus is decreasing extremely. Under the circumstances, an accuracy of focusing the surface position of an exposure target substrate on the imaging plane of the pattern of a mask, that is, focusing accuracy is also increasingly becoming stricter. Particularly, this is because a measurement error of the focus detection system is readily generated due to the thickness nonuniformity of a resist applied to the substrate or depending on the pattern on the substrate.

More specifically, the thickness nonuniformity of the resist readily occurs near a peripheral circuit pattern or scribe line, resulting in an increase in the step on the resist surface. When this occurs, the tilt angle of the resist surface increases locally (a local tilt occurs) even if the substrate has a flat surface, so that the reflection angle of reflected light detected by the focus detection system with respect to the substrate often locally, largely fluctuates. In some cases, the focus detection system may not exactly measure the surface position of the substrate.

A high-reflectance area (e.g., a dense pattern area) and a low-reflectance area (e.g., a sparse pattern area) may coexist on the substrate surface. The reflectance of the substrate to reflected light detected by the focus detection system often largely fluctuates locally even if the substrate has a flat surface. In some cases, the focus detection system may not exactly measure the surface position of the substrate.

For example, as shown in FIG. 20, consider a case in which a high-reflectance area (an area indicated by a white portion) HA and a low-reflectance area (an area indicated by a hatched portion) LA coexist on a substrate SB. A measurement area MM onto which a slit image is projected by irradiation with measurement light has a side in the longitudinal direction ($\beta'$ direction), which is tilted with respect to the boundary between the high-reflectance area HA and the low-reflectance area LA by an angle A. The measurement direction is almost perpendicular to the $\beta'$ direction, that is, the $\alpha'$ direction.

FIG. 21 shows the reflected light intensity distributions in three sections perpendicular to the $\beta'$ direction, that is, sections AA', BB', and CC'. As shown in FIG. 20, the sections AA' and CC' have uniform reflectances, respectively. As shown in FIG. 21, the reflected light intensity distributions in the sections AA' and CC' have good symmetries. In contrast, as shown in FIG. 20, the section BB' has different reflectances. As shown in FIG. 21, the reflected light intensity distribution in the section BB' has a poor symmetry. In this manner, the reflectance of the substrate to reflected light detected by the focus detection system often locally, largely fluctuates even if the substrate has a flat surface. That is, the reflected light intensity distribution often has a poor symmetry in a local area (in the vicinity of the boundary between the high-reflectance area HA and the low-reflectance area LA). Consequently, the measurement value obtained by the focus detection system, that is, the barycentric position of the reflected light intensity distribution locally shifts from the actual surface position of the substrate. In some cases, the focus detection system may not exactly measure the surface position of the substrate.

To solve this problem, Japanese Patent Laid-Open No. 11-16827 discloses a technique of arranging light projecting optical systems and light receiving optical systems of two surface information detection systems (focus detection systems) at positions which face each other on the opposite side of the normal to the upper surface of the substrate. The light projecting optical systems of the two surface information detection systems direct light beams such that they enter the substrate from two different directions on a plane including the normal to the upper surface of the substrate. Upon being reflected by the substrate, the light beams are directed in two different directions on the plane including the normal to the upper surface of the substrate, and detected by the light receiving systems of the two surface information detection systems. As disclosed in Japanese Patent Laid-Open No. 11-16827, the two surface information detection systems measure the surface position of the substrate based on the detection results obtained by the light receiving systems. With this operation, errors of the measurement values obtained by the focus detection systems, which are attributed to, for example, steps, are reduced to some extent.

However, the technique disclosed in Japanese Patent Laid-Open No. 11-16827 separately arranges the light projecting optical systems of the two surface information detection systems (focus detection systems), and also separately arranges their light receiving optical systems. This makes it difficult to ensure almost the same characteristics of the light projecting optical systems and light receiving optical systems between the two surface information detection systems. It is also difficult to allow the two focus detection systems to project slit images having nearly the same shape to almost the same position on the substrate. Even when the light beams are directed such that they enter the surface of the substrate from two different directions, it is impossible to sufficiently reduce errors of the measurement values obtained by the focus detection systems, which are attributed to, for example, steps. In some cases, the focus detection systems cannot accurately measure the surface position of the substrate.

SUMMARY OF THE INVENTION

The present invention provides a position detection apparatus and exposure apparatus which can measure the surface position of a substrate with a higher accuracy.

According to the first aspect of the present invention, there is provided a position detection apparatus comprising: a light projecting optical system which has an optical axis, and which causes two light beams symmetrical about the optical axis to enter a substrate; a light receiving optical system which receives the two light beams which have emerged from the light projecting optical system and are reflected by the substrate; a light receiving unit which is arranged at a position shifted in an optical axis direction of the light receiving optical system from an imaging plane of the substrate set by the light receiving optical system; a detection unit which detects positions of the two light beams which have entered the light receiving unit; and a calculator which calculates a surface position of the substrate in a normal direction based on the positions of the two light beams, which are detected by the detection unit, wherein at least one of the light projecting optical system and the light receiving optical system is shared for the two light beams.

According to the second aspect of the present invention, there is provided an exposure apparatus which exposes a substrate to light via a mask, the apparatus comprising: a projection optical system which projects light from the illuminated mask onto the substrate; a substrate stage which holds the substrate; and the above-described position detection apparatus which detects a surface position, in an optical axis direction of the projection optical system, of the substrate held by the substrate stage.

According to the third aspect of the present invention, there is provided a device manufacturing method comprising the steps of: exposing a substrate to light using the above-described exposure apparatus; and developing the substrate exposed in the exposing step.

According to the present invention, it is possible to, for example, measure the surface position of a substrate with a higher accuracy.

Further features of the present invention will become apparent from the following description of exemplary embodiments with reference to the attached drawings.

DESCRIPTION OF THE EMBODIMENTS

An exposure apparatus having a position detection apparatus according to an embodiment is an apparatus which projects and transfers the pattern of a mask onto a processing target by exposure. Examples of the mask are a reticle. An example of the processing target is a substrate. Examples of the substrate are a single-crystal semiconductor substrate (wafer) and a glass substrate for a liquid crystal display (LCD). An example of the exposure apparatus is an exposure apparatus of a step-and-scan scheme. The exposure apparatus of this scheme is suitable for lithography on the order of submicron or quarter micron or less. Also, an example of the position detection apparatus according to this embodiment is an apparatus which measures the surface position of a substrate using an optical pickup unit in, for example, a CD unit or DVD unit.

Figure 1:
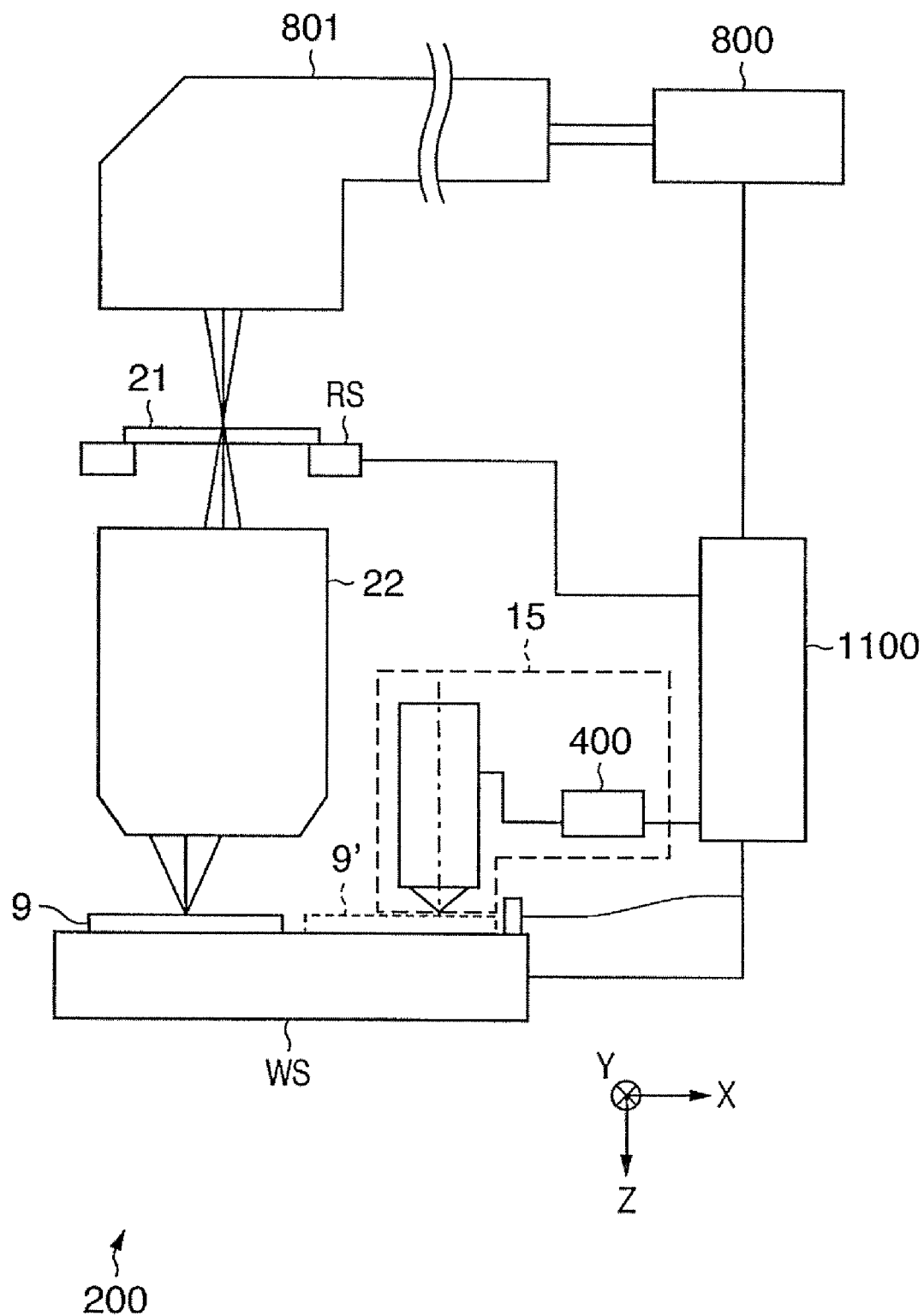
FIG. 1 is a view showing the arrangement of an exposure apparatus according to the first embodiment of the present invention.

An exposure apparatus 200 according to the first embodiment of the present invention will be explained first with reference to FIG. 1. FIG. 1 is a view showing the arrangement of the exposure apparatus 200 according to the first embodiment of the present invention.

As shown in FIG. 1, the exposure apparatus 200 comprises an illumination optical system 801, a mask stage RS which holds a mask 21, a projection optical system 22, a substrate stage WS which holds a substrate 9, a position detection apparatus 15, and a controller 1100.

The controller 1100 has a CPU and memory, and electrically connects to a light source 800, the illumination optical system 801, the mask stage RS, the substrate stage WS, and the position detection apparatus 15 to control the operation of the exposure apparatus 200. For example, the controller 1100 controls the position detection apparatus 15 to compute the surface position of the substrate 9. Upon receiving the computation result of the surface position of the substrate 9 from the position detection apparatus 15, the controller 1100 controls to drive the substrate stage WS based on the surface position of the substrate 9.

The illumination optical system 801 illuminates a surface (the upper surface of the mask 21) with a light beam emitted by the light source 800. The illumination optical system 801 shapes the light beam into a predetermined exposure slit shape suitable for exposure to illuminate the mask 21 with it. The illumination optical system 801 includes, for example, a lens, mirror, optical integrator, and stop. In the illumination optical system 801, for example, a condenser lens, fly-eye lens, aperture stop, condenser lens, slit, and light projecting imaging optical system are accommodated in the order named. The illumination optical system 801 may use both light on the axis and light off the axis. The optical integrator may include an integrator formed by stacking a fly-eye lens and two cylindrical lens arrays (or lenticular lenses). An optical rod or diffractive element may substitute for the integrator.

The light source 800 uses, for example, a laser. Examples of the laser are an ArF excimer laser having a wavelength of about 193 nm, and a KrF excimer laser having a wavelength of about 248 nm. The type of light source 800 is not particularly limited to an excimer laser. For example, the light source 800 may use an $F_2$ laser beam having a wavelength of about 157 nm or EUV (Extreme UltraViolet) light having a wavelength of 20 nm or less.

The mask 21 is made of, for example, quartz. A circuit pattern to be transferred is formed on the mask 21 by, for example, Cr. The mask 21 is supported (held) by the mask stage RS. Light diffracted by the circuit pattern of the mask 21 is projected onto the substrate 9 via the projection optical system 22. The mask 21 and substrate 9 have an optically conjugated relation. By scanning the mask 21 and substrate 9 at a speed ratio matching the reduction magnification ratio, the pattern of the mask 21 is transferred onto the substrate 9.

The mask stage RS supports (holds) the mask 21 via a mask chuck (not shown), and connects to a moving mechanism (not shown). The moving mechanism includes, for example, a linear motor, and drives the mask stage RS in the X-axis direction, the Y-axis direction, the Z-axis direction, and the rotation directions about the respective axes so as to move the mask 21. For example, a mask detection unit (not shown) of an oblique incidence system is provided near the mask 21. The mask detection unit (not shown) detects the position of the mask 21. Based on this detection result, the controller 1100 controls to drive the mask stage RS so as to arrange the mask 21 at a predetermined position.

The projection optical system 22 has a function of imaging a light beam, which is diffracted by the object plane (the upper surface of the mask 21), on the image plane (focal plane). The projection optical system 22 directs light diffracted by the circuit pattern of the mask 21 to the substrate 9, to form an image corresponding to the circuit pattern on the substrate 9. The projection optical system 22 may include an optical system having only a plurality of lens elements, or may include an optical system (catadioptric system) having a plurality of lens elements and at least one concave mirror. The projection optical system 22 may also include an optical system having a plurality of lens elements and at least one diffractive optical element such as a kinoform. If chromatic aberration correction is necessary, the projection optical system 22 may include a plurality of lens elements made of glass materials having different dispersion values (Abbe values), or may include an optical system in which a diffractive optical element disperses light in a direction opposite to a lens element.

The upper surface of the substrate 9 is coated with a photoresist. In this embodiment, the substrate 9 serves as a processing target onto which the pattern of the mask 21 is transferred. At the same time, the substrate 9 serves as a detection target the position, in the normal direction, of which is detected by the position detection apparatus 15.

The substrate stage WS supports (holds) the substrate 9 via a substrate chuck (not shown), and connects to a moving mechanism (not shown). The moving mechanism includes, for example, a linear motor, and drives the substrate stage WS in the X-axis direction, the Y-axis direction, the Z-axis direction, and the rotation directions about the respective axes so as to move the substrate 9.

A laser interferometer (not shown), for example, monitors the positions of the mask stage RS and substrate stage WS to drive them at a predetermined speed ratio. The substrate stage WS is set on, for example, a stage base supported on a floor or the like via a damper. The mask stage RS and projection optical system 22 are set on, for example, a lens barrel base (not shown) supported on a base frame, which is mounted on a floor or the like, via a damper.

During scanning exposure in a one shot region, the position detection apparatus 15 detects the light receiving position, on a light receiving element 13 (see FIG. 2), of measurement light reflected by the substrate 9. Based on the detected light receiving position, the position detection apparatus 15 computes the surface position of the substrate 9. The position detection apparatus 15 sends the computed surface position information of the substrate 9 to the controller 1100. Based on the computed surface position of the substrate 9, the controller 1100 calculates the amount of shift from the exposure image plane (the imaging plane of the pattern of the mask 21). Based on the calculated amount of shift, the controller 1100 controls to drive the substrate stage WS such that the surface position and tilt of the substrate 9 match the imaging plane of the pattern of the mask 21.

Figure 9:
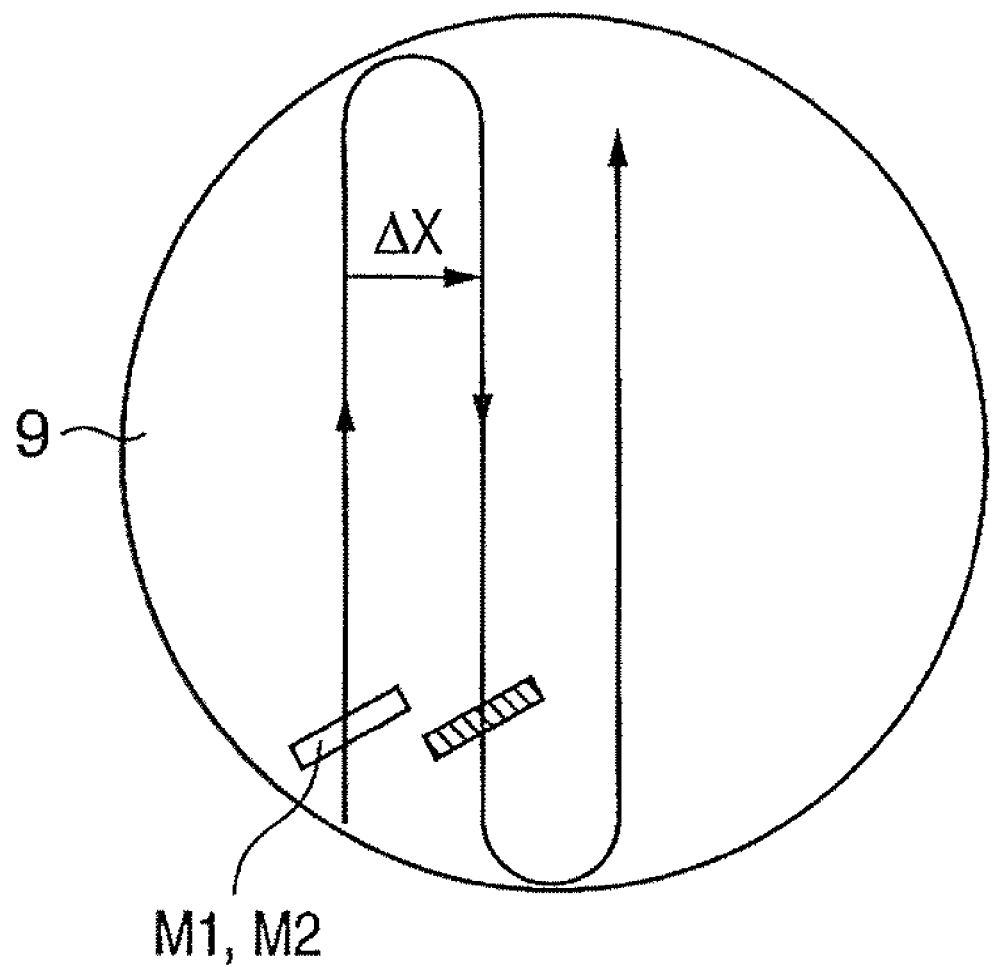
FIG. 9 is a view showing the first surface position measurement method according to the first embodiment of the present invention.

Points at which the surface position (focus) of the substrate 9 is measured will be explained. As shown in FIG. 9, the position detection apparatus 15 measures the surface position of the substrate 9 while scanning the substrate stage WS in the scanning direction (Y direction) over the entire surface of the substrate 9. The substrate stage WS is stepped in a direction (X direction) perpendicular to the scanning direction by $\Delta X$. The controller 1100 repeats these operations to perform profile measurement on the entire surface of the substrate 9. As shown in FIG. 9, a slit image M1 and M2 are formed on the substrate 9 by the incident light component (−1st-order light component) B1 and the incident light component (+1st-order light component) B2, respectively.

Figure 10:
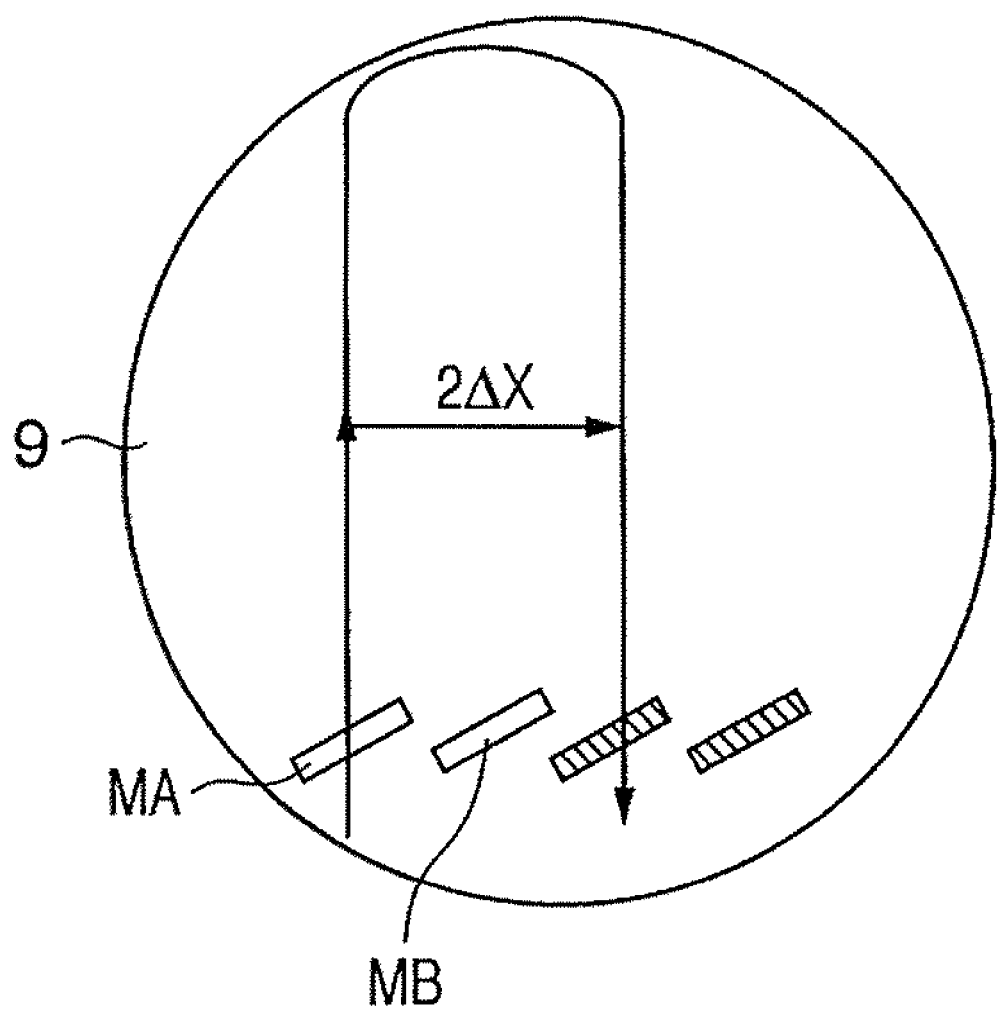
FIG. 10 is a view showing the second surface position measurement method according to the first embodiment of the present invention.

To attain high throughput, a plurality of position detection apparatuses 15 may be used to simultaneously measure the surface positions at different points on the substrate 9. For example, as shown in FIG. 10, consider a case in which two position detection apparatuses (first position detection apparatus and second position detection apparatus) are juxtaposed in the X direction with a spacing $\Delta X$. In this case, a slit image MA irradiated by the first position detection apparatus and a slit image MB irradiated by the second position detection apparatus are simultaneously formed on the substrate 9 with the spacing $\Delta X$. The controller 1100 controls the first position detection apparatus and second position detection apparatus to measure the surface positions of the substrate 9 while scanning the substrate stage WS in the scanning direction (Y direction) over the entire surface of the substrate 9. The controller 1100 steps the substrate stage WS in a direction (X direction) perpendicular to the scanning direction by $2\Delta X$, and controls the first position detection apparatus and second position detection apparatus to measure the surface positions of the substrate 9. The controller 1100 repeats these operations to perform profile measurement on the entire surface of the substrate 9. The times taken for measurement by the first position detection apparatus and second position detection apparatus are nearly half the time taken for measurement by a single position detection apparatus 15.

A slit 3S (see FIG. 2) of a slit plate 3 of the position detection apparatus 15 may be of a diffraction grating type in which a plurality of slits are arrayed at a predetermined interval. In this case, the position detection apparatus 15 may individually detect the light receiving positions, on the light receiving element 13 (see FIG. 2), of light components which are diffracted by the respective slits and reflected by the substrate 9 to individually measure the surface positions of the substrate 9 in the irradiated regions of the respective slits.

A method of correcting the surface position of the substrate 9 using focus and tilt measurement in scanning exposure, after measuring the surface position of the substrate 9 will be explained. The position detection apparatus 15 measures the position (the surface position of the substrate 9) of the upper surface of the substrate 9 in the normal direction, and sends the surface position information of the substrate 9 to the controller 1100. The controller 1100 stores the surface position information of the substrate 9. The controller 1100 controls to drive the substrate stage WS such that an exposure target shot region on the substrate 9 is positioned under a projection lens (not shown) of the projection optical system 22. Based on the stored surface position information of the substrate 9, the controller 1100 generates three-dimensional data (surface shape data) of the surface position of the substrate 9 for a region near the exposure target shot region. Based on the generated three-dimensional data of the surface position of the substrate 9, the controller 1100 calculates the amount of shift from the exposure image plane (the imaging plane of the pattern of the mask 21) for the region near the exposure target shot region. The controller 1100 controls to drive the substrate stage WS in the Z direction and tilt direction such that the surface position and tilt of the substrate 9 match the imaging plane of the pattern of the mask 21. With these operations, the controller 1100 exposes the slit region on the substrate and controls to scan-drive the substrate stage WS in the Y direction. After completing the transfer onto the exposure target shot region, the controller 1100 performs the same operations for the next exposure target shot region. The controller 1100 determines whether a shot region to be exposed remains, and repeats the above-described operations until all the shot regions are exposed. If the controller 1100 determines that the transfer onto all the shot regions is complete, it recovers the substrate 9 and completes the exposure process.

The controller 1100 may store Z-coordinate information as the surface position information of the substrate 9, and store X-Y coordinate information as the X-Y driving position information of the substrate stage. Before the transfer onto the first exposure target shot region, the controller 1100 may generate three-dimensional data (surface shape data) of the surface position of the substrate 9 in all the shot regions based on the stored surface position information of the substrate 9. The controller 1100 may calculate the amount of shift from the exposure image plane (the imaging plane of the pattern of the mask 21) for all the shot regions based on the three-dimensional data of the surface position of the substrate 9 for all the shot regions.

Only one substrate stage WS may be provided, or a plurality of substrate stages WS may be provided, which reciprocate between an exposure station for exposing a substrate and a measurement station for performing the alignment measurement and surface position measurement of the substrate. The position detection apparatus is arranged on the measurement station side.

Figure 2:
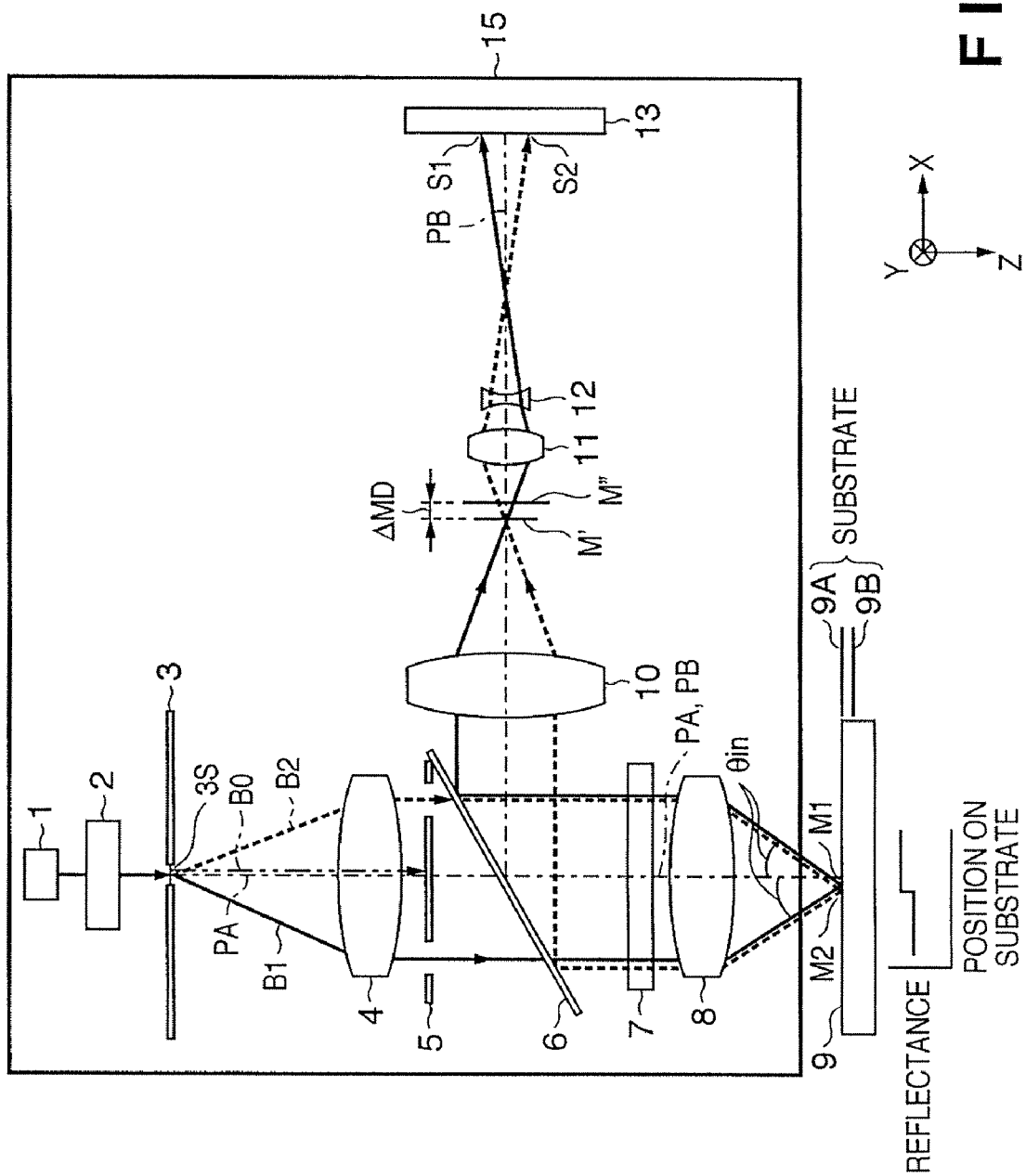
FIG. 2 is a view showing the schematic arrangement of a position detection apparatus according to the first embodiment of the present invention.

The arrangement and operation of the position detection apparatus will be explained. FIG. 2 is a view showing the schematic arrangement of the position detection apparatus according to the first embodiment of the present invention.

The position detection apparatus 15 has a function (of a focus detection system) of detecting the position (surface position) of the surface of the substrate 9 in the Z direction. The position detection apparatus 15 comprises a light projecting optical system, light receiving optical system, and arithmetic processor 400 (see FIG. 1). The arithmetic processor 400 comprises a light receiving position detection unit (not shown; detection unit), calculation unit (not shown; computer), and arithmetic processing unit (not shown; computer).

The light projecting optical system comprises a light projecting illumination optical system 2, the pattern plate 3, a light projecting imaging optical system, a filter 5, a polarization beam splitter 6, and a $\lambda/4$ plate 7. The light projecting imaging optical system includes lenses 4 and 8. A light source 1, the light projecting illumination optical system 2, the pattern plate 3, the lens 4, the filter 5, the polarization beam splitter 6, the $\lambda/4$ plate 7, the lens 8, and the substrate 9 are arranged such that an optical axis PA of the light projecting optical system matches their centers.

The light receiving optical system comprises a light receiving imaging optical system, the $\lambda/4$ plate 7, the polarization beam splitter 6, a light receiving enlargement optical system, and the light receiving element 13. The light receiving imaging optical system includes the lens 8 and a lens 10. The light receiving enlargement optical system includes lenses 11 and 12. The lens 8, λ/4 plate 7, polarization beam splitter 6, lenses 10, 11, and 12, light receiving element 13, and substrate 9 are arranged such that an optical axis PB of the light receiving optical system matches their centers. The optical axis PB matches the optical axis PA in a portion from the substrate 9 to the polarization beam splitter 6, and runs in a direction in which it intersects the optical axis PA in a portion from the polarization beam splitter 6 to the light receiving element 13.

The light source 1 is located upstream of the optical axis PA of the light projecting optical system, and emits a light beam (focus measurement light beam) using, for example, an LED, LD, or halogen lamp.

The light projecting illumination optical system 2 is located downstream of the light source 1 along the optical axis PA, and directs the light beam emitted by the light source 1 to the downstream side along the optical axis PA to illuminate the pattern plate 3. The light projecting illumination optical system 2 has a function of controlling the illumination intensity uniformity and polarization state. In this embodiment, the light projecting illumination optical system 2 polarizes components of the light beam, which is emitted by the light source 1, in the same direction to generate a P-polarized light component (the electric field of which oscillates in the drawing surface direction), thereby illuminating the pattern plate 3 with it.

On the downstream side of the light projecting illumination optical system 2 along the optical axis PA, the pattern plate 3 is conjugate to the image plane of the light projecting imaging optical system (lenses 4 and 8). The pattern plate 3 opens near the optical axis PA, at which the pattern (measurement pattern) of, for example, a rectangular transmitting slit 3S is formed. The pattern plate 3 is, for example, a glass plate coated with Cr, except the transmitting slit 3S. The transmitting slit may be of a single slit type or a diffraction grating type in which a plurality of slits are juxtaposed. The transmitting slit itself may be formed in a diffraction grating pattern. Alternatively, the pattern plate may be made of a high-transmittance material, and a rectangular reflecting slit pattern made of a high-reflectance material may be formed only near the optical axis PA on the pattern plate.

The lens 4 is located downstream of the pattern plate 3 along the optical axis PA, and refracts and directs the light beam having passed through the pattern plate 3. For example, the lens 4 refracts and directs, to the filter 5, a 0th-order light component B0, −1st-order light component B1, and +1st-order light component B2 diffracted (scattered) by the transmitting slit 3S of the pattern plate 3. The 0th-order light component B0 travels a path close to the optical axis PA of the light projecting optical system. The −1st-order light component B1 and +1st-order light component B2 travel paths away from the optical axis PA of the light projecting optical system along it. The lens 4 may further refract diffracted light components of the second and higher orders.

The filter 5 is located downstream of the lens 4 along the optical axis PA. The filter 5 opens at its portion other than portions near the optical axis PA. This allows the filter 5 to transmit certain components of the light beam refracted by the lens 4. That is, the filter 5 cuts off the 0th-order light component B0, while it transmits a plurality of light beam components of the ±nth orders (n: natural number). For example, the filter 5 transmits the −1st-order light component B1 and +1st-order light component B2.

The polarization beam splitter 6 is located downstream of the filter 5 along the optical axis PA. On the downstream side of the λ/4 plate 7 along the optical axis PB, the polarization beam splitter 6 is inserted between the lenses 4, 8, and 10. With this arrangement, the polarization beam splitter 6 splits the light beam. That is, the polarization beam splitter 6 transmits and directs, to the lens 8, a light component (P-polarized light component) which has entered it via the filter 5 from the lens 4. The polarization beam splitter 6 reflects and directs, to the lens 10, a light component (S-polarized light component) which has entered it via the λ/4 plate 7 from the lens 8.

The λ/4 plate 7 is located downstream of the polarization beam splitter 6 along the optical axis PA, and directs the light beam having passed through the polarization beam splitter 6 to the downstream side along the optical axis PA, so that it enters the lens 8. In addition, the λ/4 plate 7 is located downstream of the lens 8 along the optical axis PB, and directs the light beam having passed through the lens 8 to the downstream side along the optical axis PB, so that it enters the polarization beam splitter 6. At this time, the λ/4 plate 7 alternately converts a linearly polarized light component and a circularly polarized light component. For example, the λ/4 plate 7 converts a light component (P-polarized light component) which has entered from the polarization beam splitter 6 into a circularly polarized light component, so that it enters the lens 8. The λ/4 plate 7 converts a light component (circularly polarized light component) which has entered from the lens 8 into an S-polarized light component, so that it enters the polarization beam splitter 6.

The lens 8 is located downstream of the λ/4 plate 7 along the optical axis PA, and refracts and directs the light beam having passed through the λ/4 plate 7 to the substrate 9. That is, the light projecting imaging optical system (lenses 4 and 8) of the light projecting optical system refracts the light beam diffracted by the pattern of the transmitting slit 3S of the pattern plate 3, to image the pattern of the pattern plate 3 on the substrate 9. That is, the light projecting imaging optical system of the light projecting optical system directs the two light beam components such that they enter the substrate 9 at symmetrical angles about the normal to the surface of the substrate 9. The lens 8 also refracts and directs, to the λ/4 plate 7, the light reflected by the substrate 9.

The lens 10 is located downstream of the polarization beam splitter 6 along the optical axis PB, and images the light beam, which is reflected by the polarization beam splitter 6, on an imaging plane M'. That is, the light receiving imaging optical system (lenses 8 and 10) refracts the light beam reflected by the substrate 9, to image the pattern of the pattern plate 3 on the imaging plane M'. The lens 10 directs, to the enlargement optical system (lenses 11 and 12), the light beam reflected by the polarization beam splitter 6.

The enlargement optical system (lenses 11 and 12) is located downstream of the lens 10 along the optical axis PB, and further refracts and directs, to the light receiving element 13, the light beam refracted by the lens 10. More specifically, on the light receiving element 13, the enlargement optical system (lenses 11 and 12) enlarges and forms an image of the pattern projected onto a plane (to be referred to as an imaging shift plane hereinafter) M" shifted from the imaging plane M' of the light receiving imaging optical system (lenses 8 and 10) to the downstream side along the optical axis PB. The imaging shift plane M" is conjugate to the light receiving surface of the light receiving element 13 with respect to the enlargement optical system.

The light receiving element (light receiving unit) 13 is located downstream of the enlargement optical system (lenses 11 and 12) along the optical axis PB, and detects the light beam emerging from the enlargement optical system.

Examples of the light receiving element 13 are CCDs (an area sensor and line sensor) and a four-division sensor.

The light receiving position detection unit (not shown) of the arithmetic processor 400 (see FIG. 1) connects to the light receiving element 13 of the light receiving optical system and the calculation unit (not shown) of the arithmetic processor 400 (see FIG. 1). The light receiving position detection unit receives an analog signal corresponding to a photoelectrically converged charge for each pixel from the light receiving element 13. Based on the received analog signals, the light receiving position detection unit detects light receiving positions S1 and S2 at which two components of the light beam emerging from the light receiving optical system enter the light receiving element 13. The light receiving positions S1 and S2 are the barycentric positions of images formed on the light receiving element 13 by the two light beam components. The light receiving position detection unit sends the information on the light receiving positions S1 and S2 of the two light beam components to the calculation unit.

The calculation unit connects to the light receiving position detection unit and the arithmetic processing unit (not shown) of the arithmetic processor 400 (see FIG. 1). The calculation unit receives the information on the light receiving positions S1 and S2 of the two light beam components from the light receiving position detection unit. Based on the received information on the light receiving positions of the two light beam components, the calculation unit calculates the interval between the light receiving positions of the two light beam components. The calculation unit sends the calculated interval information to the arithmetic processing unit.

The arithmetic processing unit connects to the calculation unit and a driving controller (not shown) of the controller 1100 (see FIG. 1). The arithmetic processing unit receives the calculated interval information from the calculation unit. Based on the calculated interval information, the arithmetic processing unit computes the surface position of the substrate 9. For example, the arithmetic processing unit computes the defocus amount by comparing the calculated interval with the interval in an in-focus state. The arithmetic processing unit thus computes the surface position of the substrate 9. The arithmetic processing unit sends the surface position information of the substrate 9 to the driving controller of the controller 1100. The driving controller computes the difference between the surface position of the substrate 9 and its target surface position (a position matching the imaging plane of the pattern of the mask 21), and drives the substrate stage WS in the Z direction by the calculated difference.

The interval in an in-focus state may be preset in the arithmetic processing unit or stored in a storage unit (not shown) which can be referred to by the arithmetic processing unit. The light receiving position detection unit may detect, using a known method, the position of each reflected light component received by the light receiving element 13. If, for example, the light receiving element 13 uses a four-division sensor or two-division sensor, the position of each reflected light component received by the light receiving element 13 can be detected by calculating the ratio between the intensities of light components received by the respective divided elements. If, for example, the light receiving element 13 uses an array element such as a CCD or CMOS sensor, the position of each reflected light component received by the light receiving element 13 can be detected by calculating the barycentric position of a light receiving region based on the light intensities obtained by a plurality of elements corresponding to the size of the light receiving region.

In this manner, the light projecting optical system and light receiving optical system are shared for the above-described two light beam components.

The optical paths of the 0th-order light component B0, −1st-order light component B1, and +1st-order light component B2 diffracted by the slit 3S shown in FIG. 2 will be explained in detail.

As indicated by an alternate long and two short dashed line in FIG. 2, the 0th-order light component B0 diffracted by the slit 3S is cut off by the filter 5 after passing through the lens 4.

As indicated by a solid line in FIG. 2, the −1st-order light component B1 diffracted by the slit 3S enters the substrate 9 at an incident angle θin via the lenses 4 and 8 from the left in FIG. 2. The incident light component is reflected on the substrate 9 at the reflection angle θin. The reflected light component is received at the light receiving position S1 on the light receiving element 13 via the lens 8, λ/4 plate 7, polarization beam splitter 6, lens 10, and enlargement optical system (lenses 11 and 12). The light receiving position S1 here means the barycentric position of an image formed on the light receiving element 13 by the −1st-order light component B1.

As indicated by a broken line in FIG. 2, the +1st-order light component B2 diffracted by the slit 3S enters the substrate 9 at the incident angle θin via the lenses 4 and 8 from the right in FIG. 2. The incident light component is reflected on the substrate 9 at the reflection angle θin. The reflected light component is received at the light receiving position S2 on the light receiving element 13 via the lens 8, λ/4 plate 7, polarization beam splitter 6, lens 10 and enlargement optical system (lenses 11 and 12). The light receiving position S2 here means the barycentric position of an image formed on the light receiving element 13 by the +1st-order light component B2.

The −1st-order light component B1 and +1st-order light component B2 may be received by separate light receiving elements as long as the light receiving positions S1 and S2 are detected so as to calculate the interval.

Figure 3:
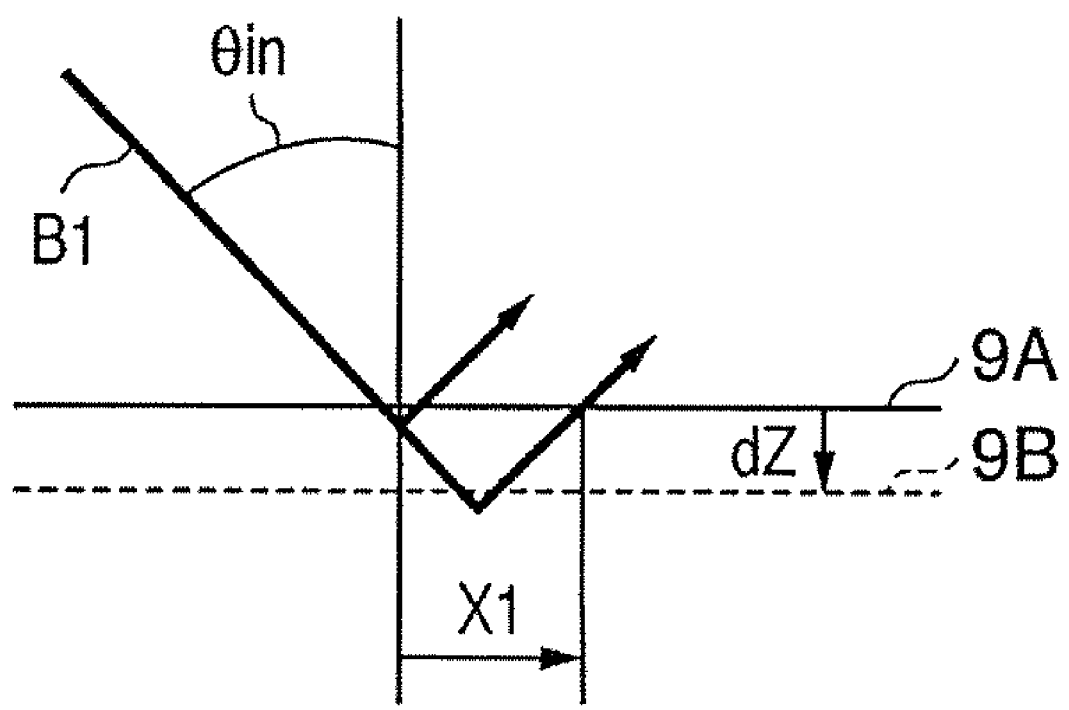
FIG. 3 is a diagram for explaining a detection principle of surface position measurement according to the first embodiment of the present invention.
Figure 4:
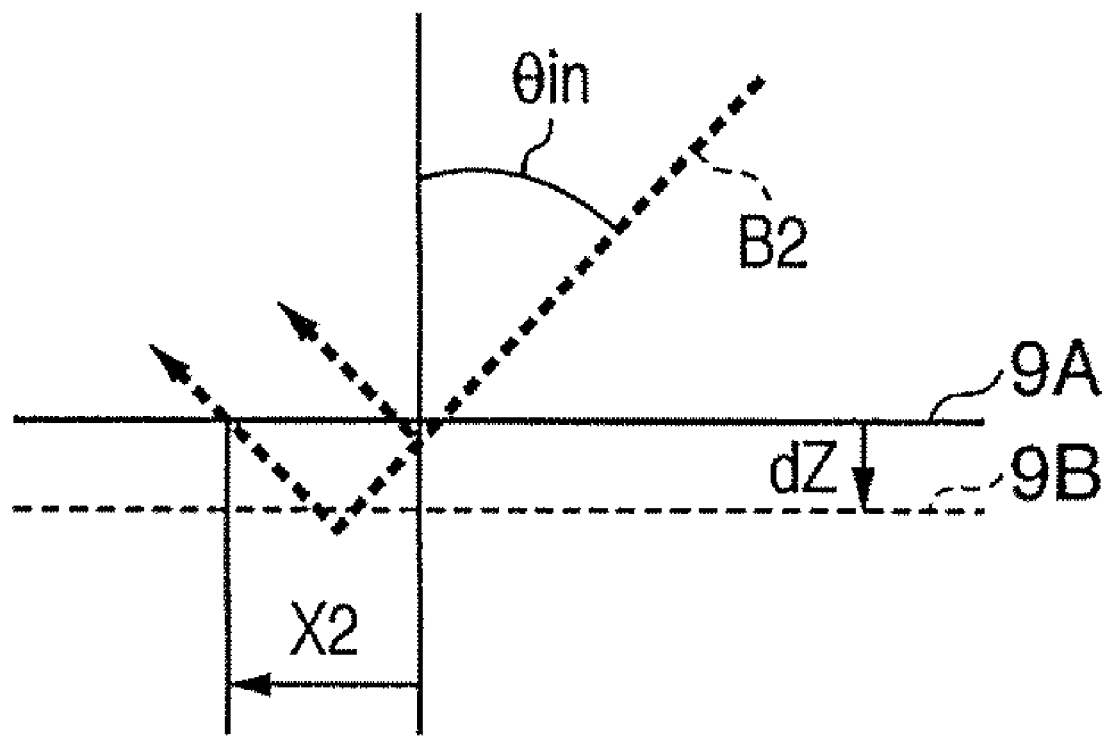
FIG. 4 is a diagram for explaining another detection principle of surface position measurement according to the first embodiment of the present invention.

Shifts in the optical paths when the surface position of the substrate 9 changes will be explained with reference to FIGS. 3 and 4. FIG. 3 is a diagram showing a shift in the optical path of the −1st-order light component B1 when the surface position of the substrate 9 changes. FIG. 4 is a diagram showing a shift in the optical path of the +1st-order light component B2 when the surface position of the substrate 9 changes.

As shown in FIG. 3, if the surface position (the position in the Z direction) of the substrate 9 changes from 9A to 9B by dZ, the −1st-order light component B1 shifts in the right direction of FIG. 3 by $X1=2\cdot\tan(\theta in)\cdot dZ$ with respect to the surface position 9A (assuming that the right direction in FIG. 3 is the positive X direction). As shown in FIG. 4, if the surface position of the substrate 9 changes from 9A to 9B by dZ, the +1st-order light component B2 shifts in the right direction of FIG. 4 by $X2=-2-\tan(\theta in)\cdot dZ$ with respect to the surface position 9A (the negative sign indicates the left direction in FIG. 4). The −1st-order light component B1 and +1st-order light component B2 shift in opposite directions in response to a change in the surface position of the substrate 9. Accordingly, an interval D between the two light receiving positions S1 and S2 on the light receiving element 13 changes. That is, by obtaining a difference $(X1-X2)\cdot M$ between the two light receiving positions S1 and S2 detected by the light receiving position detection unit, the calculation unit can calculate the interval D on the light receiving element 13 in accordance with:

$$D \approx (X1-X2)\cdot M + D0 \quad (1)$$

Let M be the imaging magnification (the product of the magnifications of the light receiving imaging optical system and light receiving enlargement optical system) of the position detection apparatus 15, and θin be the incident angle of the ±1st-order light components with respect to the substrate 9. Based on the interval D calculated by the calculation unit in accordance with equation (1), the arithmetic processing unit computes the displacement dZ in the Z direction in accordance with:

$$D = 2 \cdot M \cdot \tan(\theta in) \cdot dZ + D0 \qquad (2)$$

The arithmetic processing unit thus computes the surface position of the substrate 9.

D0 in equations (1) and (2) is the initial offset (offset amount) which occurs because the interval between the two light receiving positions is measured at a position conjugate to a surface position (a position in the Z direction) defocused from an imaging plane 9' (see FIG. 1). The initial offset D0 can be calibrated in the following way.

The driving controller drives the substrate stage, which holds the substrate 9, in the Z direction. A light shielding mechanism (not shown) alternately shields the −1st-order light component B1 and +1st-order light component B2. The light receiving position detection unit individually detects the light receiving position S1 of the −1st-order light component B1 and the light receiving position S2 of the +1st-order light component B2. Based on the information on the individually detected light receiving positions S1 and S2, the calculation unit calculates the interval D between the light receiving positions S1 and S2. Based on the calculated interval D, the arithmetic processing unit determines whether the interval D is zero. If the arithmetic processing unit determines that the interval D is not zero, the driving controller further drives the substrate stage in the Z direction. If the arithmetic processing unit determines that the interval D is zero, it sets the calculated interval D as a reference interval D1 (≈0). Based on the reference interval D1, the arithmetic processing unit computes the surface position of the substrate 9 and sets the calculated surface position as a reference surface position Z1. The surface position Z1 here means a surface position of the substrate 9, which is shifted (defocused) from the imaging plane of the pattern of the pattern plate 3 in the Z direction by (an interval ΔMD between the imaging plane M' and the imaging shift plane M")/(the magnification of the light receiving imaging optical system). That is, we have:

(the defocus amount)=(the interval ΔMD)/(the magnification of the light receiving imaging optical system) (3)

The driving controller drives the substrate stage in the Z direction by (the interval ΔMD)/(the magnification of the light receiving imaging optical system). The light receiving position detection unit detects the light receiving position S1 of the −1st-order light component B1 and the light receiving position S2 of the +1st-order light component B2. Based on the information on the individually detected light receiving positions S1 and S2, the calculation unit calculates the interval D between the light receiving positions S1 and S2. The arithmetic processing unit sets the calculated interval D as the slit interval in an offset state, that is, the above-described initial offset D0. Based on the initial offset D0, the arithmetic processing unit computes the surface position of the substrate 9, and also computes the amount of shift dZ of the surface position of the substrate 9 from an in-focus state. The initial offset D0 indicates the interval between the light receiving positions S1 and S2 in an in-focus state.

Information on nearly the half width of the effective light receiving range of the light receiving element 13 in a direction in which the light receiving positions S1 and S2 are connected may be preset in the arithmetic processing unit or may be stored in the storage unit which can be referred to by the arithmetic processing unit.

In this manner, the arithmetic processing unit sets dZ in equation (1) as a displacement (shift) in the Z direction from the focal plane (the imaging plane of the pattern image of the pattern plate 3) of the light projecting imaging optical system (lenses 4 and 8).

In normal operation, the driving controller drives the substrate stage to a position at which dZ takes zero. With this operation, the driving controller aligns the surface position of the substrate 9 with the focal plane.

Consider, for example, a case in which the numerical aperture NA of the light projecting imaging optical system including the lenses 4 and 8 is 0.6, the incident angle θin is 30° (sin(θin)<NA), and a magnification M of the enlargement optical system including the lenses 11 and 12 is 10×. The change dZ in the surface position of the substrate 9 increases to 2×10·tan 30°=11.5×. If, for example, the light receiving element 13 uses a line sensor having a pixel pitch of 5 μm (=5,000 nm), the light receiving position can be detected at a resolution of about ½₀ the pixel pitch by, for example, barycentric processing. Hence, the surface position measurement resolution in this case is 5000 nm/20/11.5=22 nm.

That is, we have:

$$ZR = Pz/20/(2M \cdot \tan(\theta in)) \qquad (4)$$

where ZR is the surface position measurement resolution, and Pz is the pixel pitch of the light receiving element 13.

In this manner, based on equation (4), the pixel pitch Pz of the light receiving element 13, the magnification M of the enlargement optical system, and the incident angle θin of the ±1st-order light components with respect to the substrate 9 can be set to satisfy the required surface position measurement resolution ZR. The numerical aperture NA of the light projecting optical system can be set to satisfy sin(θin)<NA. Furthermore, the arithmetic processing unit uses the magnification M of the enlargement optical system and the incident angle θin of the ±1st-order light components with respect to the substrate 9 to calculate the displacement dZ in the Z direction in accordance with equation (2) based on the interval D calculated by the calculation unit in accordance with equation (1).

Figure 5:
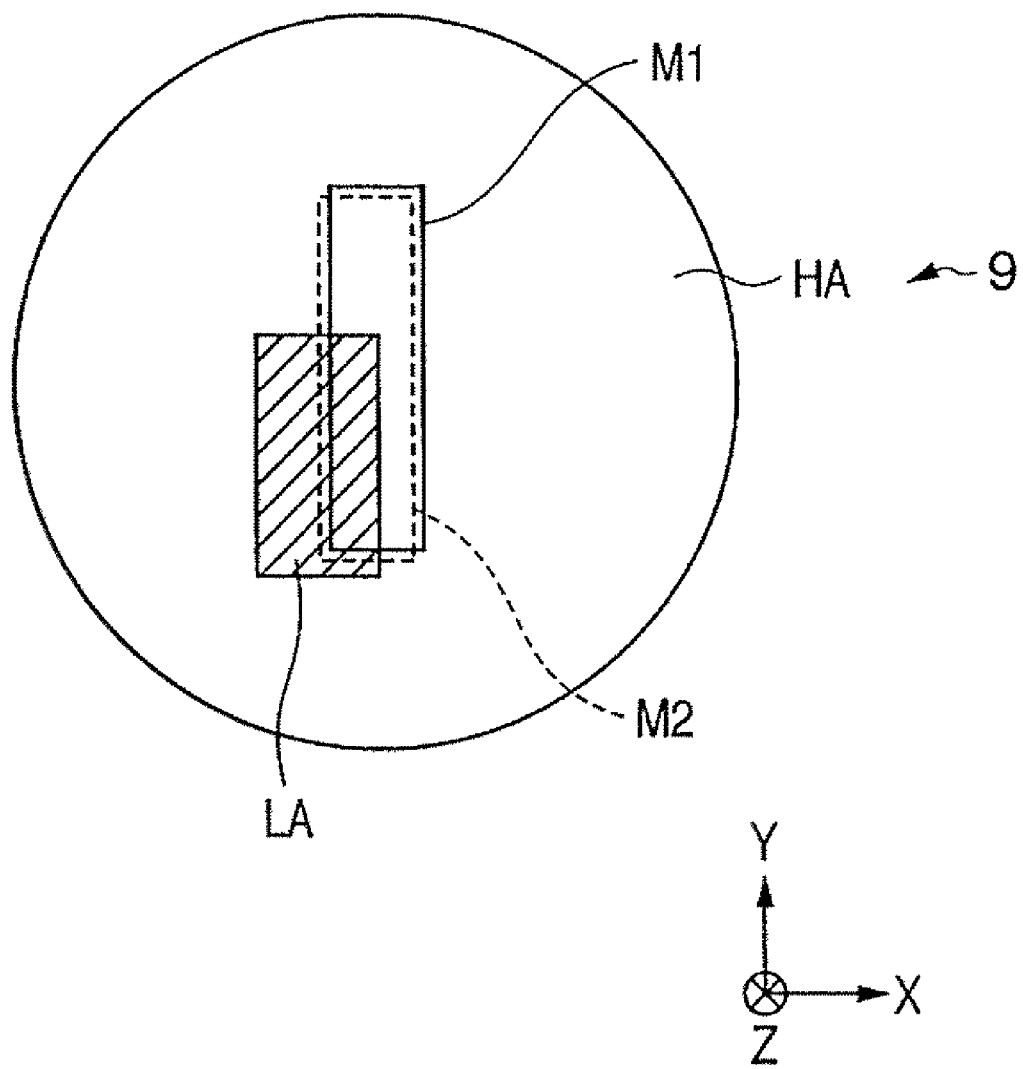
FIG. 5 is a view showing the relationship between the reflectance distribution and the measurement area on a substrate.
Figure 8:
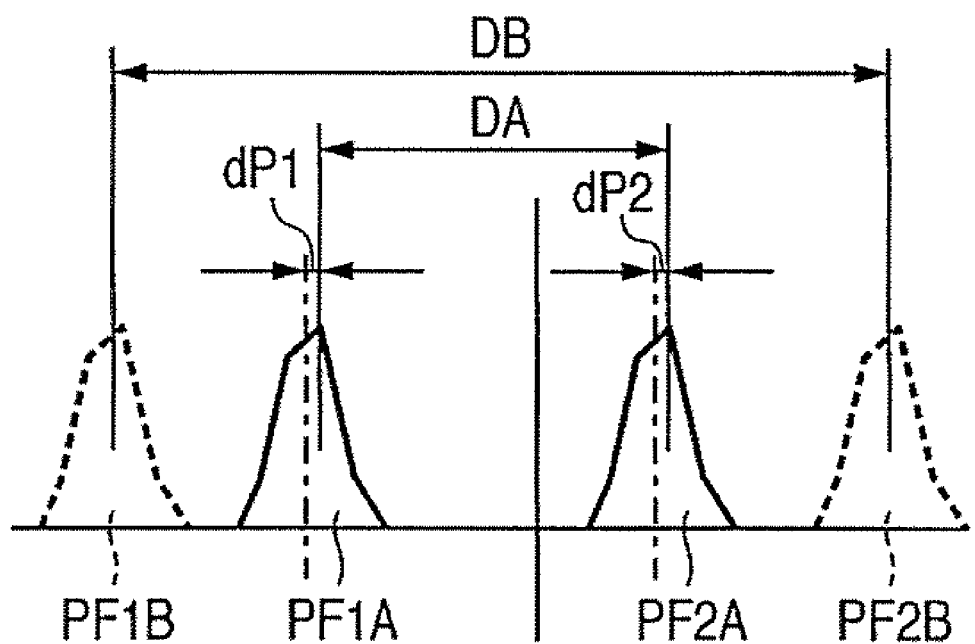
FIG. 8 is a graph for explaining signal profiles of a position detection apparatus according to the first embodiment of the present invention.

A cancel effect when the surface position of an area on the substrate 9, which exhibits a reflectance distribution is measured, will be explained with reference to FIGS. 5 and 8.

First, consider a case in which the reflectance distribution as shown in FIG. 2 lies on the substrate 9 and the surface position of an area near the boundary between a low-reflectance area LA and a high-reflectance area HA is measured. FIG. 5 is a view showing the substrate 9 when seen from a direction perpendicular to its upper surface. As shown in FIG. 5, the low-reflectance area (hatched area) LA and the high-reflectance area (white area) HA coexist on the surface of the substrate 9. In the area near the boundary between the low-reflectance area LA and the high-reflectance area HA, slit images M1 and M2 are formed by the incident light component (−1st-order light component) B1 on the left side and the incident light component (+1st-order light component) B2 on the right side, respectively, while being nearly superimposed on each other (at almost the same position).

The light receiving positions S1 and S2 corresponding to the slit images M1 and M2 will be explained with reference to FIG. 8. FIG. 8 is a graph showing the light receiving positions on the light receiving element 13. Referring to FIG. 8, solid lines indicate the intensity distributions (profiles) of received light components when the surface position of the substrate 9 is 9A, and broken lines indicate the intensity distributions (profiles) of received light components when the surface position of the substrate 9 is 9B.

First, consider profiles PF1A and PF2A indicated by the solid lines when the surface position of the substrate 9 is 9A. The profile PF1A in an area near the light receiving position S1 of the incident light component (−1st-order light component) B1 on the left side exhibits a bilaterally asymmetrical waveform in accordance with the reflectance distribution (see FIG. 2) on the substrate 9. The barycentric position of the profile PF1A shifts toward the high-reflectance area HA by dP1 from that when the reflectance distribution is uniform on the substrate 9. Similarly, the profile PF2A at the light receiving position S2 of the incident light component (+1st-order light component) B2 on the right side exhibits a bilaterally asymmetrical waveform in accordance with the reflectance distribution (see FIG. 2) on the substrate 9. The barycentric position of the profile PF2A shifts toward the high-reflectance area HA by dP2 from that when the reflectance distribution is uniform on the substrate 9. Since the light components which have entered the substrate 9 from left and right are nearly superimposed on each other on the substrate 9 (see FIG. 5), their amounts of shift are nearly equal to each other (i.e., dP1≈dP2). Hence, when the surface position of the substrate 9 is 9A, the measurement errors dP1 and dP2 of the two light receiving positions S1 and S2 due to reflectance distribution nonuniformity can be canceled by measuring an interval DA between the light receiving positions S1 and S2.

Next, consider profiles PF1B and PF2B indicated by the broken lines when the surface position of the substrate 9 is 9B. The profiles PF1B and PF2B indicated by the broken lines have a wider interval between the light receiving positions S1 and S2 than the profiles PF1A and PF2A (interval DB>interval DA). This fact represents that the light receiving positions S1 and S2 change in opposite directions with respect to the surface position of the substrate 9 (see FIGS. 3 and 4). The barycentric positions of the profiles PF1B and PF2B indicated by the broken lines shift in the same direction from those of the profiles PF1A and PF2A indicated by the solid lines, in accordance with the reflectance distribution on the substrate. That is, the barycentric positions of the profiles PF1B and PF2B indicated by the broken lines shift toward the high-reflectance area HA (in the same direction) by dP1 and dP2, respectively, from those when the reflectance distribution is uniform on the substrate 9. Their amounts of shift are nearly equal to each other (dP1≈dP2). Hence, even when the surface position of the substrate 9 is 9B, the measurement errors dP1 and dP2 of the two light receiving positions S1 and S2 due to reflectance distribution nonuniformity can be canceled by measuring the interval DB between the light receiving positions S1 and S2.

Figure 6:
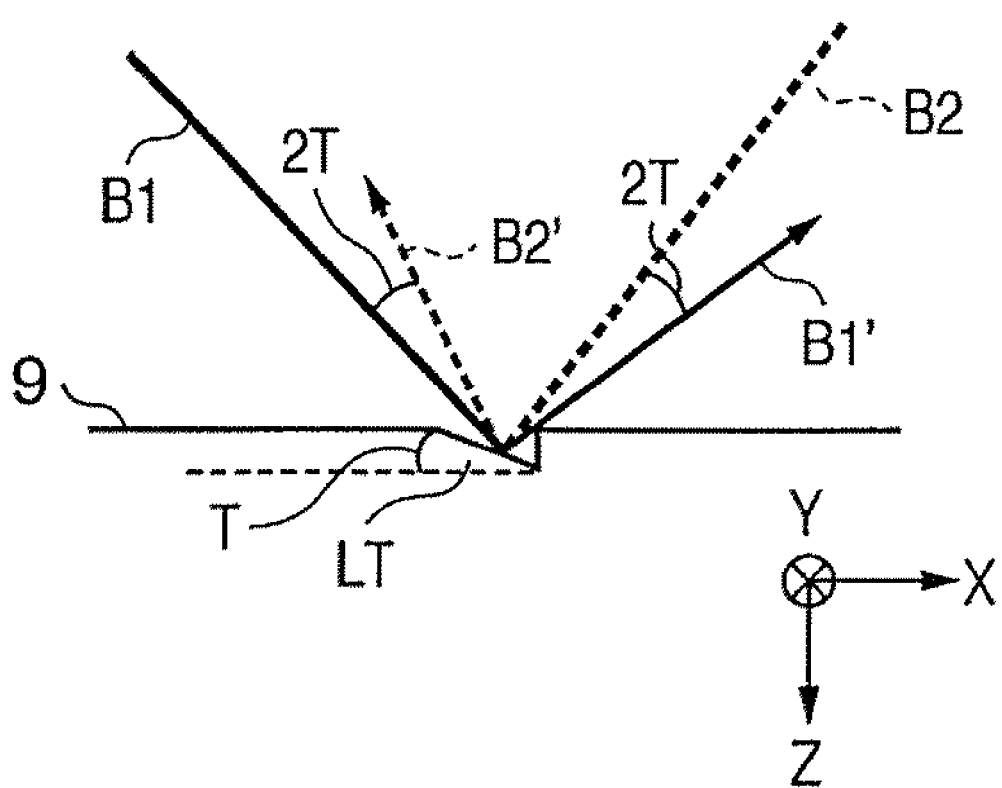
FIG. 6 is a diagram showing the optical paths of reflected light components upon a local tilt on the substrate.
Figure 7:
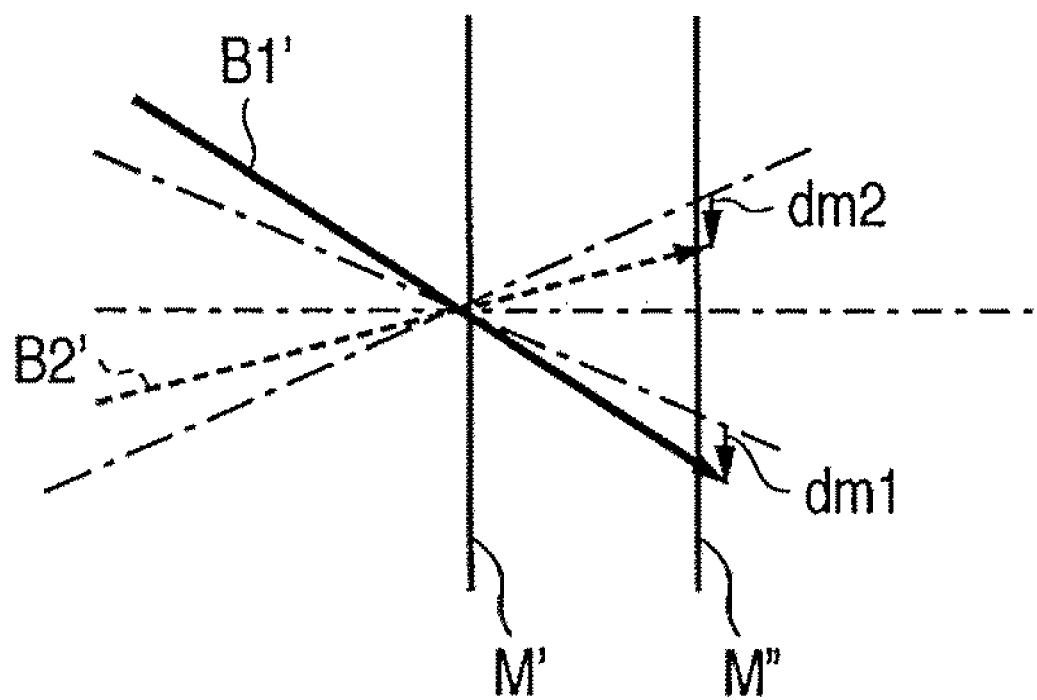
FIG. 7 is a diagram for explaining shifts in the positions of the reflected light components upon the local tilt on the substrate.

A cancel effect when the surface position of an area which exhibits a locally large tilt angle (local tilt) on the resist surface is measured will be explained with reference to FIGS. 6 to 8. FIG. 6 is a diagram showing the optical paths of reflected light components with respect to the substrate 9 upon a local tilt. FIG. 7 is a diagram for explaining shifts in the positions of the reflected light components on the imaging shift plane M" upon a local tilt. Although the incident light components and reflected light components with respect to the substrate 9 are denoted by the same reference numerals in the above description, they are denoted by different reference numerals for convenience in the following description.

As shown in FIG. 6, the reflection directions of the −1st-order light component B1 and +1st-order light component B2 locally shift upon a local tilt (tilt angle T) from those when a surface matching the surface position measurement position is free from any local tilt. That is, the reflection direction of a reflected light component B1' of the −1st-order light component B1 which has entered the substrate from left shifts by an angle 2T from that when the surface is free from any local tilt. Similarly, the reflection direction of a reflected light component B2' of the +1st-order light component B2 which has entered the substrate from right shifts by an angle 2T from that when the surface is free from any local tilt. The reflected light components B1' and B2' shift in the same rotation direction.

As shown in FIG. 7, the positions of the reflected light components B1' and B2"on the imaging plane M" shift in accordance with the shifts of the reflection directions of the reflected light components B1' and B2'.

That is, the position of the −1st-order light component B1' matches that of the +1st-order light component B2' on the imaging plane M'. Also on the imaging plane M', the position of the −1st-order light component B1' (or +1st-order light component B2') when the substrate has a local tilt matches that of the −1st-order light component B1' (or +1st-order light component B2') (indicated by alternate long and short dashed lines) when the surface is free from any local tilt.

On the imaging shift plane M", as shown in FIG. 7, the positions of the reflected light components B1' and B2' shift by amounts corresponding to the local tilt amount (tilt angle T). That is, on the imaging shift plane M", the position of the reflected light component B1' of the incident light component B1 on the left side shifts downward in FIG. 7 by dm1 from that when the substrate has no amount of tilt. Also on the imaging shift plane M", the position of the reflected light component B2' of the incident light component B2 on the right side similarly shifts downward in FIG. 7 by dm2 from that when the substrate has no local amount of tilt. As described above, since changes in the incident light angles of the incident light components B1 and B2 upon a local tilt are almost the same (angle 2T), we have dm1≈dm2.

In this manner, the amount of shift dm1 of the position of the −1st-order light component B1' is nearly equal to the shift amount dm2 of the position of the +1st-order light component B2" on the imaging shift plane M". For this reason, also on the light receiving surface of the light receiving element 13, that is conjugate to the imaging shift plane M", the amount of shift of the light receiving position S1 of the −1st-order light component B1' is nearly equal to that of the light receiving position S2 of the +1st-order light component B2' in the same direction. As a shift in the position of the −1st-order light component B1' is nearly equal in amount to that of the +1st-order light component B2' in the same direction upon a local tilt of the substrate 9, the amounts of shift can be canceled by calculating their difference (see FIG. 8). That is, the light receiving positions S1 and S2 change in opposite directions on the light receiving element 13 in response to a change in the surface position of the substrate 9 (see FIG. 8). On the other hand, the light receiving positions S1 and S2 shift in the same direction on the light receiving element 13 upon a local tilt of the substrate 9. Hence, measurement errors M·dm1 and M·dm2 of the light receiving positions S1 and S2 upon a local tilt can be canceled by calculating the interval D between the light receiving positions S1 and S2 (M: enlargement magnification).

Unlike the technique disclosed in Japanese Patent Laid-Open No. 11-16827, identical slit images are formed on the substrate 9 via the same light projecting imaging optical system. This makes it easy to superimpose the two slit images on the substrate 9 so as to perform measurement while setting the same reference position. It is therefore possible to enhance an effect of canceling measurement errors due to reflectance distribution nonuniformity and a local tilt as described above.

Furthermore, the interval D between the light receiving positions S1 and S2 is calculated using the incident light components (−1st-order light component B1 and +1st-order light component B2) from two directions with respect to the substrate 9. Even when the incident angle is not set as large as 80° or more, it is possible to compute the surface position of the substrate 9. This makes it possible to compactly mount the position detection apparatus 15 in the exposure apparatus 200 even when a TTL (Through The Lens) scheme is used.

As described above, the position detection apparatus 15 according to the first embodiment of the present invention can accurately detect the surface position of the substrate 9 even when it has reflectance distribution nonuniformity or local tilt. In addition, the exposure apparatus 200 having the position detection apparatus 15 can attain high focusing accuracy even for a relatively small depth of focus, thus improving the yield. It is also possible to improve the alignment accuracy of the exposure apparatus 200, thus improving the yield and performance of a semiconductor chip.

A complex circuit pattern, scribe line, and the like are formed on the substrate 9. Since reflectance distribution nonuniformity, local tilt, and the like occur at high probabilities, the present invention produces a considerable effect in that it can reduce measurement errors due to reflectance distribution nonuniformity and local tilt. As the surface position of the substrate 9 can be accurately measured, the accuracy of focusing the substrate surface on an optimal exposure plane improves. This leads to improvements in the performance and manufacturing yield of a semiconductor device.

It should be noted that one of the light projecting optical system and light receiving optical system may be shared for the above-described two light beam components. Even in this case, the surface position of the substrate 9 can be detected with a higher accuracy than in a case in which they are separately arranged.

Figure 11:
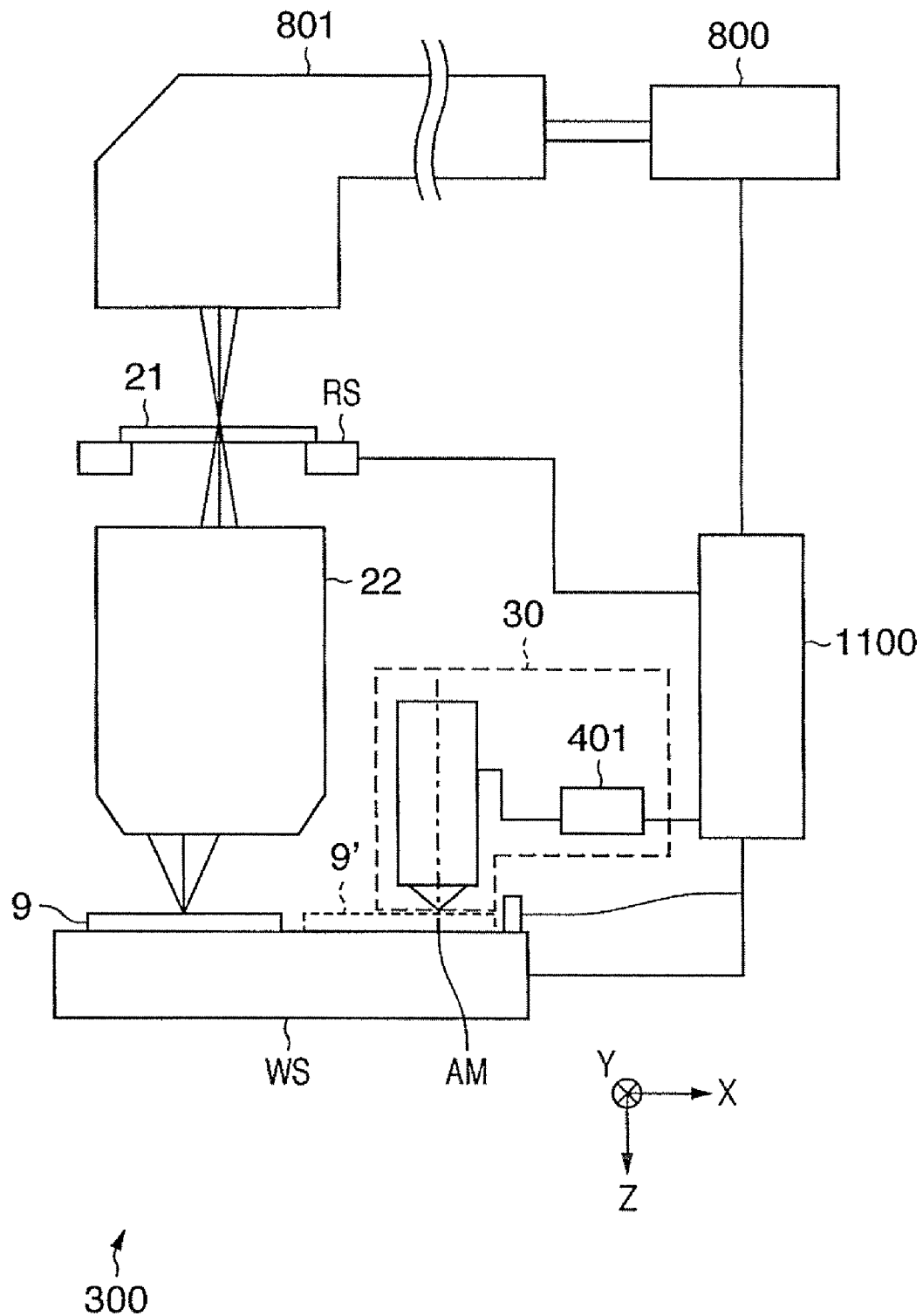
FIG. 11 is a view showing a semiconductor exposure apparatus according to the second embodiment of the present invention.

An exposure apparatus 300 according to the second embodiment of the present invention will be explained with reference to FIG. 11. FIG. 11 is a view showing the arrangement of the exposure apparatus according to the second embodiment of the present invention. Parts different from those in the first embodiment will be mainly described below, and a description of the same parts will not be repeated.

Although the exposure apparatus 300 has basically the same arrangement as that in the first embodiment, the second embodiment is different from the first embodiment in that it has a position detection apparatus 30.

The position detection apparatus 30 has a function (of an alignment detection system or alignment scope) of detecting the position (in-plane position) of the surface of a substrate 9 in the X and Y directions, in addition to a function (of a focus detection system) of detecting the position (surface position) of the surface of the substrate 9 in the Z direction. The position detection apparatus 30 detects an alignment mark AM (see FIG. 13) formed in each shot region on the substrate 9 to detect a shift in the position of the alignment mark AM from a design position. This makes it possible to accurately align (position) the X-Y position of an exposure target shot region on the substrate 9.

Figure 12:
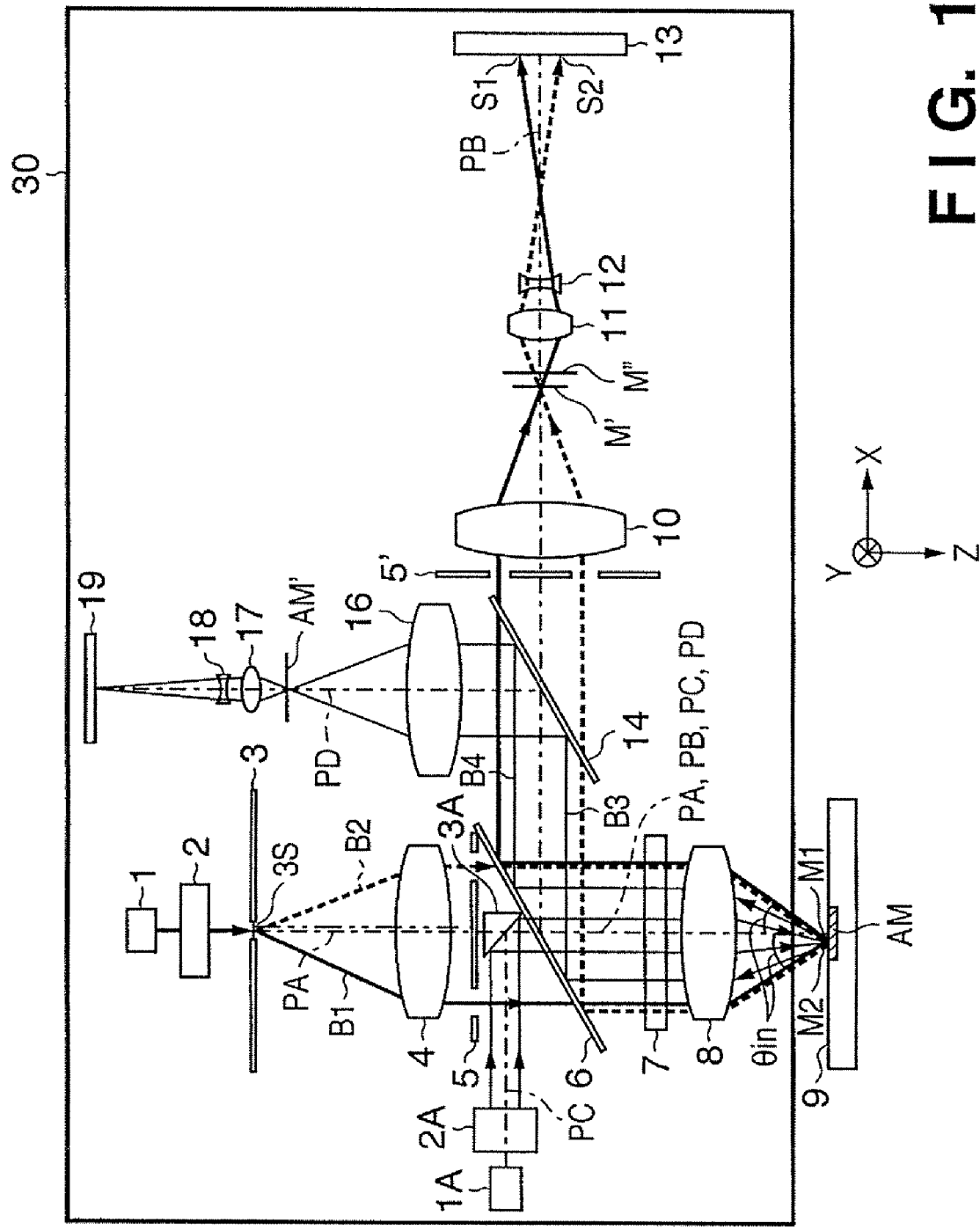
FIG. 12 is a view showing an alignment scope according to the second embodiment of the present invention.

As shown in FIG. 12, the position detection apparatus 30 comprises an alignment light projecting optical system, alignment light receiving optical system, and arithmetic processor 401. The arithmetic processor 401 comprises a light receiving position detection unit (not shown; detection unit), calculation unit (not shown; computer), and arithmetic processing unit (not shown; computer).

The alignment light projecting optical system comprises an alignment light projecting illumination optical system 2A, mirror 3A, alignment light projecting imaging optical system, polarization beam splitter 6, and λ/4 plate 7. The alignment light projecting imaging optical system includes a lens 8. A light source 1A, the alignment light projecting illumination optical system 2A, the mirror 3A, the polarization beam splitter 6, the λ/4 plate 7, the lens 8, and the substrate 9 are arranged such that an optical axis PC of the alignment light projecting optical system matches their centers. The optical axis PC runs in a direction in which it intersects an optical axis PA in a portion from the light source 1A to the mirror 3A, and matches the optical axis PA and optical axes PB and PD in a portion from the mirror 3A to the substrate 9.

The alignment light receiving optical system comprises an alignment light receiving imaging optical system, the λ/4 plate 7, the polarization beam splitter 6, a beam splitter 14, a filter 5', an alignment light receiving enlargement optical system, and a light receiving element 19. The alignment light receiving imaging optical system includes the lens 8 and a lens 16. The alignment light receiving enlargement optical system includes lenses 17 and 18. The lens 8, λ/4 plate 7, polarization beam splitter 6, beam splitter 14, lenses 16, 17, and 18, light receiving element 19, and substrate 9 are arranged such that the optical axis PD of the alignment light receiving optical system matches their centers. The optical axis PD matches the optical axes PA, PB, and PC in a portion from the substrate 9 to the polarization beam splitter 6. In a portion from the polarization beam splitter 6 to the beam splitter 14, the optical axis PD matches the optical axis PB and runs in a direction in which it intersects the optical axes PA and PC. The optical axis PD runs in a direction in which it intersects the optical axis PB in a portion from the beam splitter 14 to the light receiving element 19.

The light source 1A is located upstream of the optical axis PC of the light projecting optical system, and emits a light beam (alignment measurement light beam) using, for example, an LED, LD, or halogen lamp.

The alignment light projecting illumination optical system 2A is located downstream of the light source 1A along the optical axis PA, and directs the alignment measurement light beam emitted by the light source 1A to the downstream side along the optical axis PC to illuminate the mirror 3A with it. The alignment light projecting illumination optical system 2A has a function of controlling the illumination intensity uniformity and polarization state. In this embodiment, the alignment light projecting illumination optical system 2A polarizes components of the light beam, which is emitted by the light source 1A, in the same direction to generate a P-polarized light component (the electric field of which oscillates in the drawing surface direction), thereby illuminating the mirror 3A with it.

The mirror 3A is located downstream of the alignment light projecting illumination optical system 2A along the optical axis PC, and reflects and directs, to the polarization beam splitter 6, the alignment measurement light beam emerging from the alignment light projecting illumination optical system 2A. The mirror 3A is arranged inside the openings on the two sides of a filter 5 so as not to shield a −1st-order light component B1 and +1st-order light component B2 for surface position detection.

The polarization beam splitter 6 is located downstream of the mirror 3A along the optical axis PC. On the downstream side of the λ/4 plate 7 along the optical axis PD, the polarization beam splitter 6 is inserted between the lenses 8 and 16. With this arrangement, the polarization beam splitter 6 diverges the light beam. That is, the polarization beam splitter 6 transmits and directs, to the lens 8, an alignment measurement light component (P-polarized light component) which has entered it from the mirror 3A. The polarization beam splitter 6 reflects and directs, to the lens 16, an alignment measurement light component (S-polarized light component) which has entered it via the λ/4 plate 7 from the lens 8.

On the downstream side of the polarization beam splitter 6 along the optical axis PD, the beam splitter 14 is inserted between the lenses 16 and 10. With this arrangement, the beam splitter 14 diverges the light beam. That is, the beam splitter 14 transmits and directs, to the lens 10, the −1st-order light component B1 and +1st-order light component B2 for surface position detection, which have entered it from the polarization beam splitter 6. The beam splitter 14 reflects and directs, to the lens 16, the alignment measurement light beam which has entered it from the polarization beam splitter 6. The beam splitter 14 sometimes transmits certain components of the alignment measurement light beam.

The λ/4 plate 7 is located downstream of the polarization beam splitter 6 along the optical axis PC, and directs the alignment measurement light beam having passed through the polarization beam splitter 6 to the downstream side along the optical axis PC, so that it enters the lens 8. The λ/4 plate 7 is located downstream of the lens 8 along the optical axis PD, and directs the alignment measurement light beam having passed through the lens 8 to the downstream side along the optical axis PD, so that it enters the polarization beam splitter 6. At this time, the λ/4 plate 7 alternately converts a linearly polarized light component and a circularly polarized light component. For example, the λ/4 plate 7 converts a light component (P-polarized light component) which has entered from the polarization beam splitter 6 into a circularly polarized light component, so that it enters the lens 8. The λ/4 plate 7 converts a light component (circularly polarized light component) which has entered from the lens 8 into an S-polarized light component, so that it enters the polarization beam splitter 6.

The lens 8 is located downstream of the λ/4 plate 7 along the optical axis PC, and refracts and directs the alignment measurement light beam having passed through the λ/4 plate 7 to an alignment mark AM on the substrate 9. That is, the alignment light projecting imaging optical system (lens 8) refracts the alignment measurement light beam, so that it enters the alignment mark AM on the substrate 9. The lens 8 also refracts and directs, to the λ/4 plate 7, an alignment measurement light component reflected or scattered by the alignment mark AM on the substrate 9.

Figure 13:
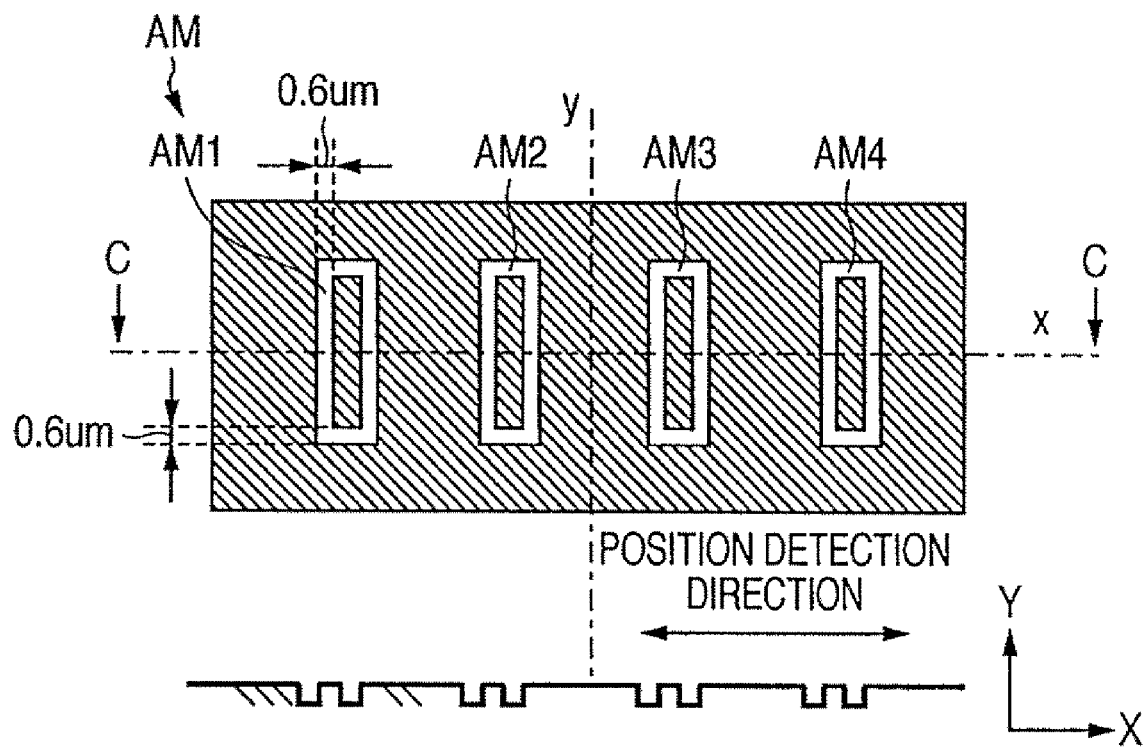
FIG. 13 is a view showing an alignment mark according to the second embodiment of the present invention.

The alignment mark AM is, for example, a mark with a shape as shown in FIG. 13. Referring to FIG. 13, the upper side shows a plan view of the alignment mark AM when seen from above, and the lower side shows a sectional view taken along a line C-C shown on the upper side. Also referring to FIG. 13, mark portions AM1 to AM4 indicate rectangular marks each having a dimension of 4 μm in the X direction serving as the measurement direction and a dimension of 20 μm in the Y direction serving as the non-measurement direction. The mark portions AM1 to AM4 are juxtaposed in the X direction at a pitch of 20 μm. Each of the mark portions AM1 to AM4 in the alignment mark AM has a shape in which a rectangular portion having a line width of 0.6 μm is recessed with respect to the periphery by, for example, etching. A resist is applied on the mark portions in practice, but is not illustrated in FIG. 13.

The lens 16 is located downstream of the beam splitter 14 along the optical axis PD, and images the alignment measurement light beam, which is reflected by the beam splitter 14, on an alignment imaging plane AM'. That is, the alignment light receiving imaging optical system (lenses 8 and 16) refracts the alignment measurement light beam reflected by the substrate 9, to form an image of the alignment mark AM on the alignment imaging plane AM'. The lens 16 directs, to the alignment enlargement optical system (lenses 17 and 18), the alignment measurement light beam reflected by the beam splitter 14.

The alignment enlargement optical system (lenses 17 and 18) is located downstream of the lens 16 along the optical axis PD, and further refracts and directs, to the light receiving element 19, the alignment measurement light beam refracted by the lens 16. More specifically, on the light receiving element 19, the alignment enlargement optical system (lenses 17 and 18) enlarges and forms an image of the alignment mark AM projected onto the alignment imaging plane AM' of the alignment light receiving imaging optical system (lenses 8 and 16). The alignment imaging plane AM' is conjugate to the light receiving surface of the light receiving element 19 with respect to the alignment enlargement optical system.

The light receiving element 19 is located downstream of the alignment enlargement optical system (lenses 17 and 18) along the optical axis PD, and detects the light beam emerging from the alignment enlargement optical system. Examples of the light receiving element 19 are CCDs (an area sensor and line sensor) and a four-division sensor.

The filter 5' is located downstream of the beam splitter 14 along the optical axis PB. The filter 5' opens at its portion other than portions near the optical axis PB, like the filter 5. This allows the filter 5' to cut off the certain components of the alignment measurement light beam, which are transmitted through the beam splitter 14. The filter 5' also passes a plurality of light beam components of the ±nth orders (n: natural number). For example, the filter 5' passes the −1st-order light component B1 and +1st-order light component B2.

The light receiving position detection unit (not shown) of the arithmetic processor 401 (see FIG. 11) also connects to the light receiving element 19 of the alignment light receiving optical system and the calculation unit (not shown) of the arithmetic processor 401 (see FIG. 11). The light receiving position detection unit receives an analog signal corresponding to a photoelectrically converged charge for each pixel from the light receiving element 19. Based on the received analog signals, the light receiving position detection unit detects an alignment light receiving position at which the alignment measurement light beam reflected by the alignment mark AM enters the light receiving element 19.

Figure 14:
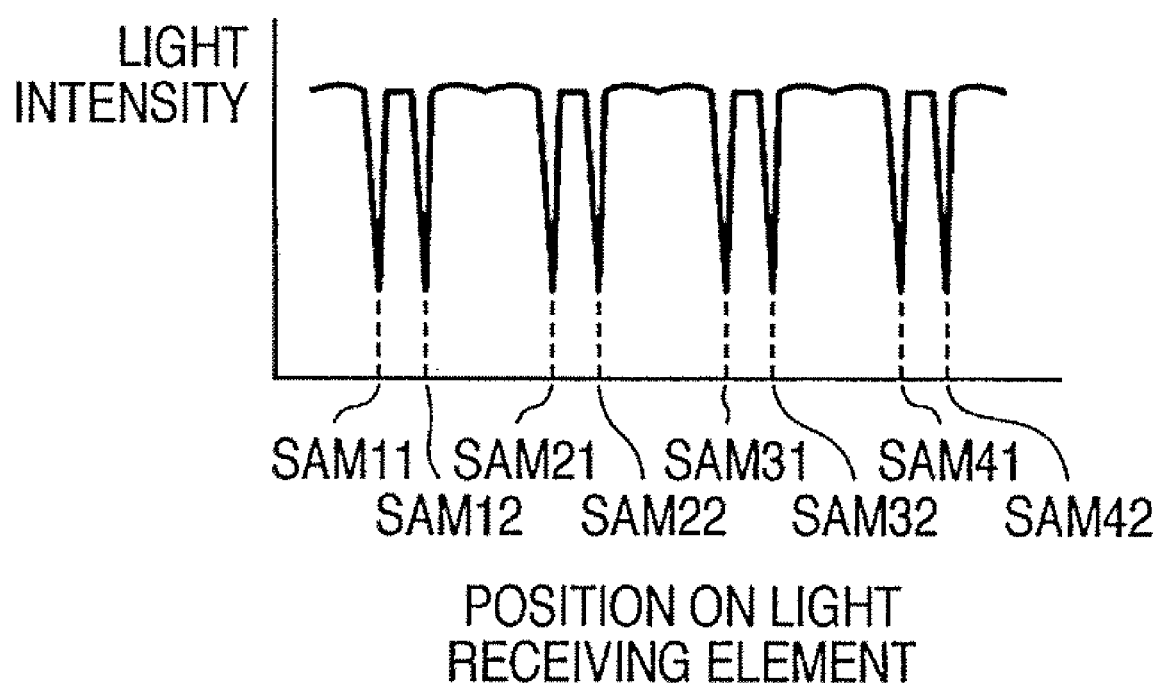
FIG. 14 is a chart showing a waveform signal of the alignment mark according to the second embodiment of the present invention.

For example, the light receiving position detection unit receives the profiles of the received light beam as shown in FIG. 14 from the light receiving element 19. For example, upon entering the mark portions AM1 to AM4 in the alignment mark AM shown in FIG. 13, the alignment measurement light beam is sometimes scattered at the edges of the mark portions AM1 to AM4 at an angle that is so large that it cannot fall within a numerical aperture NA of the lens 8. Certain components of the alignment measurement light beam sometimes interfere with each other after being scattered at the edges. Accordingly, the light receiving position detection unit detects positions, at which the intensity of the received alignment measurement light beam is locally low, as alignment light receiving positions SAM11 to SAM42. The alignment light receiving positions SAM11 and SAM12 correspond to the mark portion AM1. The alignment light receiving positions SAM21 and SAM22 correspond to the mark portion AM2. The alignment light receiving positions SAM31 and SAM32 correspond to the mark portion AM3. The alignment light receiving positions SAM41 and SAM42 correspond to the mark portion AM4.

The light receiving position detection unit uses a template matching method to two-dimensionally detect the alignment light receiving positions. The template matching method calculates the correlation between the acquired two-dimensional distribution information (image information) of the intensity of the alignment measurement light beam and a preset template, and detects a position with a highest degree of correlation as a two-dimensional alignment light receiving position. For example, the light receiving position detection unit can attain a resolution of 1/20 to 1/50 pixel by obtaining the barycentric pixel positions of areas spaced apart from a pixel exhibiting a locally low intensity (see SAM11 to SAM42 in FIG. 14) in the left and right directions by several pixels.

The calculation unit connects to the light receiving position detection unit and the arithmetic processing unit (not shown) of the arithmetic processor 401 (see FIG. 11). The calculation unit receives the two-dimensional alignment light receiving position information from the light receiving position detection unit. Based on the received two-dimensional alignment light receiving position information, the calculation unit calculates the average position of mark images (images of the mark portions). The calculation unit sends the average position information of the mark images to the arithmetic processing unit.

For example, the calculation unit calculates the central positions of the mark images by obtaining the barycentric positions of the two-dimensional alignment light receiving positions corresponding to the mark portions AM1 to AM4. More specifically, the calculation unit calculates central positions X1, X2, X3, and X4 of four mark images of the alignment mark AM on the light receiving element 19 (unit: pixel). The calculation unit averages the central positions X1 to X4 of the respective mark images to obtain the average position of the mark images in accordance with:

$$Xa=[X1+X2+X3+X4]/4 \quad (5)$$

The arithmetic processing unit connects to the calculation unit and driving controller (not shown) of the controller 1100 (see FIG. 11). The arithmetic processing unit receives the calculated average position information of the mark images. Based on the calculated average position information of the mark images, the arithmetic processing unit computes the in-plane direction position (X-Y position) of the substrate 9.

For example, the arithmetic processing unit computes a shift in the position of the alignment mark AM on the substrate 9 based on the average position of the mark images. Let Ma be the imaging magnification (the product of the magnifications of the alignment light receiving imaging optical system and alignment light receiving enlargement optical system) of the position detection apparatus 30, and Px be the pixel pitch in the alignment measurement direction of the light receiving element 19. Then, the arithmetic processing unit computes a shift in the position of the alignment mark AM on the substrate 9 in accordance with:

$$Xw=Xa/(Px \cdot Ma) \quad (6)$$

The arithmetic processing unit thus computes the in-plane direction position of the substrate 9. The arithmetic processing unit sends the in-plane direction position information of the substrate 9 to a driving controller of a controller 1100. With this operation, the driving controller computes the difference (shift) between the in-plane direction position of the substrate 9 and a target in-plane direction position (the imaging plane of the pattern of the mask 21), and drives a substrate stage WS in the X and Y directions by this difference.

A sequence in which the position detection apparatus detects the in-plane direction position of the substrate 9 (executes alignment detection) will be explained.

To detect the position of an alignment mark arranged in each shot region on the substrate 9, the controller 1100 drives the substrate stage WS such that a shot alignment mark to be measured is positioned below the position detection apparatus 30 (step A1). The controller 1100 controls the position detection apparatus 30 to measure (detect, calculate, and compute) the surface position of the substrate 9 (step A2). Based on the surface position of the substrate 9, the controller 1100 drives and focuses the substrate stage WS on the best focus position (the imaging plane of the pattern of the mask 21 in the Z direction) (step A3). The controller 1100 controls the position detection apparatus 30 to capture the alignment mark AM and to measure the amount of positional shift of the alignment mark AM in the target shot region based on equations (5) and (6) (step A4). After that, the controller 1100 repeats the sequence processes from steps A1 to A4 until all the shot regions are measured.

Although only alignment mark position measurement in the X direction has been described above, an alignment mark in the Y direction obtained by rotating the alignment mark shown in FIG. 13 through 90° is also measured. At the same time, the position of a shot region in the Y direction is measured. To detect the position of the alignment mark in the Y direction, another beam splitter is inserted into the subsequent stage of the beam splitter 14 shown in FIG. 12 to provide a Y-direction position detection system. The system which measures the position of the alignment mark in the Y direction is the one formed by rotating the optical system from the lens 16 to the light receiving element 19 shown in FIG. 12 about the optical axis through 90°.

After completing the measurement of the alignment marks in the respective shot regions, the amount of positional shift of the entire substrate is calculated using the measurement values of the respective shots. At this time, the shift amount, magnification, and amount of rotation of the substrate in the X and Y directions are calculated to perform the so-called global alignment using a total of six parameters as correction variables. After aligning the respective shot regions on the substrate 9 based on these parameters, the circuit pattern of the mask 21 is transferred onto each shot region.

In the above-described way, even when reflectance distribution nonuniformity or local tilt occurs near the alignment mark AM, it is possible to accurately align the surface of the substrate 9 with the imaging plane, in the in-plane direction, of the pattern of the mask 21 without its influence. This makes it possible to improve the alignment accuracy of the exposure apparatus 300, leading to improvements in the performance and manufacturing yield of a semiconductor device.

Figure 15:
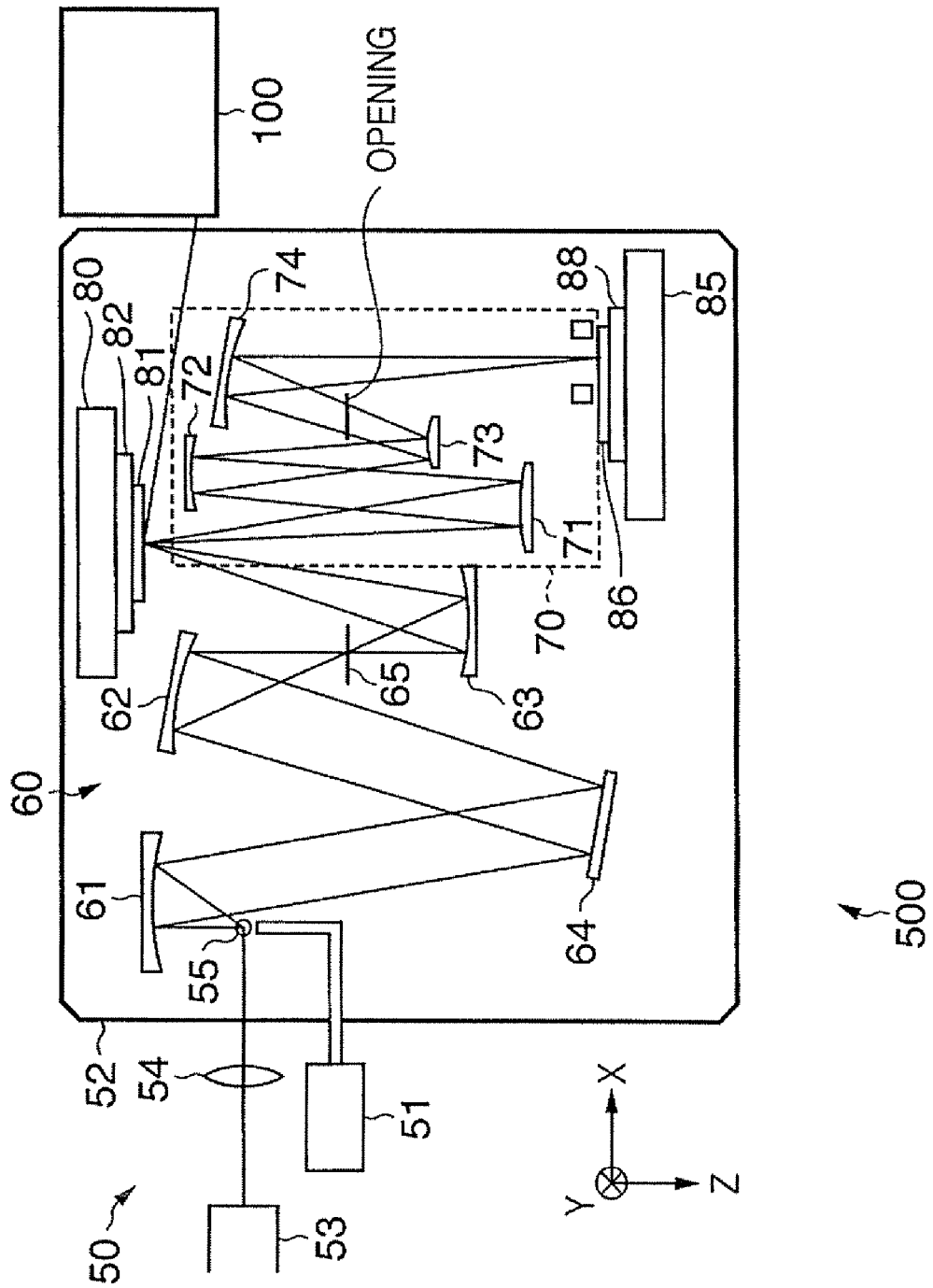
FIG. 15 is a view showing a semiconductor exposure apparatus which comprises an exposure light source using EUV light according to the third embodiment of the present invention.

An exposure apparatus 500 according to the third embodiment will be explained with reference to FIG. 15. FIG. 15 is a view showing the arrangement of the exposure apparatus according to the third embodiment of the present invention. Parts different from those in the first embodiment will be mainly described below, and a description of the same parts will not be repeated.

As shown in FIG. 15, the exposure apparatus 500 comprises an illumination optical system 60, mask (pattern plate) 81, projection optical system 70, mask stage (pattern plate stage) 80, substrate stage 85, vacuum system, and position detection apparatus 100.

Although the position detection apparatus 100 has basically the same arrangement as that of the position detection apparatus 15 in the first embodiment, they are different in the following points. As in the first embodiment, the position detection apparatus 100 is used to accurately align the upper surface of a substrate 86 with the plane on which the pattern of the mask 81 is imaged via the projection optical system (PO) 70.

The illumination optical system 60 is located downstream of an EUV light source 50 along the optical axis. The illumination optical system 60 includes, for example, first to third mirrors 61 to 63 of a multilayer film or oblique incidence type, and an optical integrator 64. The first condensing mirror 61 on the first stage serves to converge EUV light nearly isotropically radiated by a laser generator (laser plasma) 53. The optical integrator 64 serves to uniformly illuminate the mask 81 with a predetermined numerical aperture. An aperture 65 for limiting an illuminated region on surface of the mask 81 to an arcuate shape is arranged at the conjugate position to the mask 81 in the illumination optical system 60.

The EUV light source 50 is, for example, a laser plasma light source. In the EUV light source 50, a target material which is supplied from a target supply unit 51 and placed in a vacuum chamber 52 is irradiated with a high-intensity pulse laser beam which is emitted by the laser generator 53 and converged by a condenser lens 54. A high-temperature plasma 55 is then generated in the EUV light source 50, so that it uses EUV light which is radiated by the plasma 55 and has a wavelength of, for example, about 13 nm. The target material is, for example, a metal thin film, inert gas, or droplets. The target supply unit 51 supplies a target material into the vacuum chamber 52 by, for example, a gas jet. To increase the average intensity of the EUV light radiated by the plasma 55, the laser generator 53 generates a pulse laser beam with a relatively high repetition frequency. For example, the laser generator 53 generates a pulse laser beam with a repetition frequency of several kHz.

The projection optical system 70 uses a plurality of mirrors (reflecting optical elements) 71 to 74. If the projection optical system 70 has a small number of mirrors 71 to 74, aberration correction becomes difficult even though the use efficiency of the EUV light can be enhanced. To prevent this problem, the projection optical system 70 has about four to six mirrors necessary for aberration correction. The mirrors 71 to 74 each have a convex or concave, spherical or aspherical reflection surface. A numerical aperture NA of the projection optical system 70 is about 0.1 to 0.3. Light enters the projection optical system 70 from the mask 81 at a predetermined acute angle with respect to the normal to the upper surface of the mask 81. The light emerges from the projection optical system 70 and enters the substrate 86 roughly parallel to the normal to the upper surface of the substrate 86. That is, the projection optical system 70 is an image-side telecentric optical system.

The mirrors 71 to 74 are formed in the following way. That is, a substrate made of a material having high rigidity, high degree of hardness, and low coefficient of thermal expansion, such as a low-expansion glass or silicon carbide, is ground and polished into a predetermined reflection surface shape. After that, a multilayer film of, for example, molybdenum/silicon is formed on the reflection surface. Assume that the incident angles of the EUV light with respect to the mirrors 71 to 74 change depending on a position in the reflection surface. In this case, as is obvious from the Bragg's equation, a wavelength of the EUV light, at which the reflectance becomes high, shifts depending on the position in the reflection surface. To prevent this problem, it is necessary to give the film cycle distribution to the reflection surfaces of the mirrors 71 to 74 so as to efficiently reflect EUV light having the same wavelength.

The mask stage 80 and substrate stage 85 are synchronously scanned at a speed ratio proportional to the reduction magnification. Note that the scanning direction is the X direction and a direction perpendicular to the X direction is the Y direction in a plane parallel to the upper surface of the mask 81 or substrate 86. Note also that a direction perpendicular to the upper surface of the mask 81 or substrate 86 is the Z direction.

The mask 81 is of a reflection type. The mask stage 80 holds the mask 81 via a mask chuck 82. The mask stage 80 has a mechanism which moves in the X direction at high speed. The mask stage 80 also has a mechanism which finely moves in the X direction, the Y direction, the Z direction, and the rotation directions about the respective axes so as to align the mask 81. A laser interferometer measures the position and orientation of the mask stage 80. Based on this measurement result, a controller (driving controller) controls the position and orientation of the mask stage 80 and drives it.

The substrate stage 85 holds the substrate 86 via a substrate chuck 88. Like the mask stage 80, the substrate stage 85 has a mechanism which moves in the X direction at high speed. The substrate stage 85 also has a mechanism which finely moves in the X direction, the Y direction, the Z direction, and the rotation directions about the respective axes so as to align the substrate 86. A laser interferometer measures the position and orientation of the substrate stage 85. Based on this measurement result, a controller (driving controller) controls the position and orientation of the substrate stage 85 and drives it.

Figure 16:
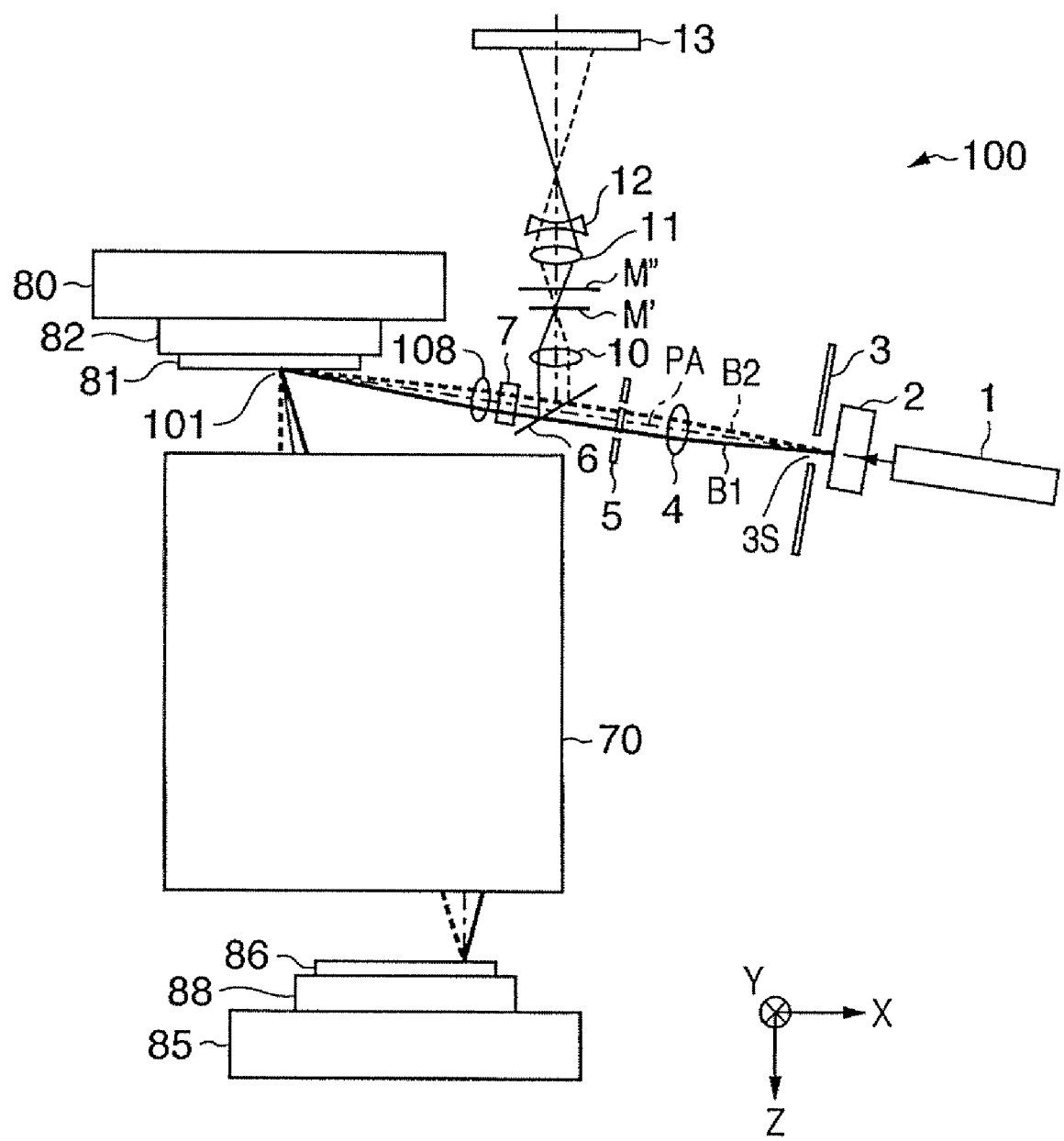
FIG. 16 is a view for explaining a surface position measurement method according to the third embodiment of the present invention.

The detailed arrangement and operation of the position detection apparatus 100 will be explained with reference to FIG. 16.

The position detection apparatus 100 comprises a light projecting optical system, light receiving optical system, and arithmetic processor 400 (see FIG. 1).

The light projecting optical system comprises a light projecting illumination optical system 2, pattern plate 3, light projecting imaging optical system, filter 5, polarization beam splitter 6, and $\lambda/4$ plate 7. The light projecting imaging optical system includes lenses 4 and 108.

The lens 108 is located downstream of the $\lambda/4$ plate 7 along an optical axis PA, and refracts and directs a light beam having passed through the $\lambda/4$ plate 7 to the mask 81. That is, the light projecting imaging optical system (lenses 4 and 108) refracts the light beam diffracted by the pattern of a transmitting slit 3S of the pattern plate 3, so that it enters the mask 81.

A diffraction grating pattern 101 (see FIG. 17) is formed on the mask 81. Upon receiving the diffraction action by the diffraction grating pattern 101, a −1st-order light component B1 and +1st-order light component B2 which have entered the mask 81 enter the projection optical system 70 at an angle that falls within its NA. Since the projection optical system 70 is of a reflection type (see FIG. 15), it is free from any influence of chromatic aberration which depends on the wavelength. Hence, the −1st-order light component B1 and +1st-order light component B2 which have received the diffraction action by the diffraction grating pattern 101 form images of the pattern of the rectangular transmitting slit 3S on the substrate 86 via the projection optical system 70 without any influence of chromatic aberration.

The light components (−1st-order light component B1 and +1st-order light component B2) reflected by the substrate 86 reach the mask 81 via the projection optical system 70. Upon receiving the diffraction action by the diffraction grating pattern 101 (see FIG. 17) on the mask 81 again, the −1st-order light component B1 and +1st-order light component B2 are converted into S-polarized light components after being transmitted through the λ/4 plate 7 via the lens 108. The S-polarized light components enter a lens 10 upon being reflected by the polarization beam splitter 6. The light receiving imaging optical system (lenses 108 and 10) images the pattern of the transmitting slit 3S of the pattern plate 3 on an imaging plane M' again.

The relationship between the diffraction grating pattern 101 on the mask 81 and the incident angle and diffraction angle of a light beam will be explained with reference to FIGS. 17 and 18.

Figure 17:
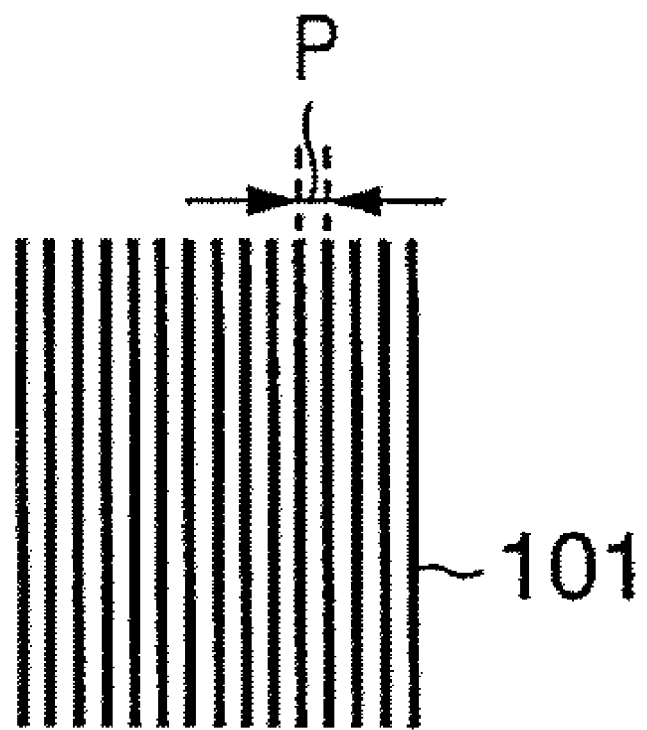
FIG. 17 is a view for exemplifying a diffraction grating on a mask according to the third embodiment of the present invention.
Figure 18:
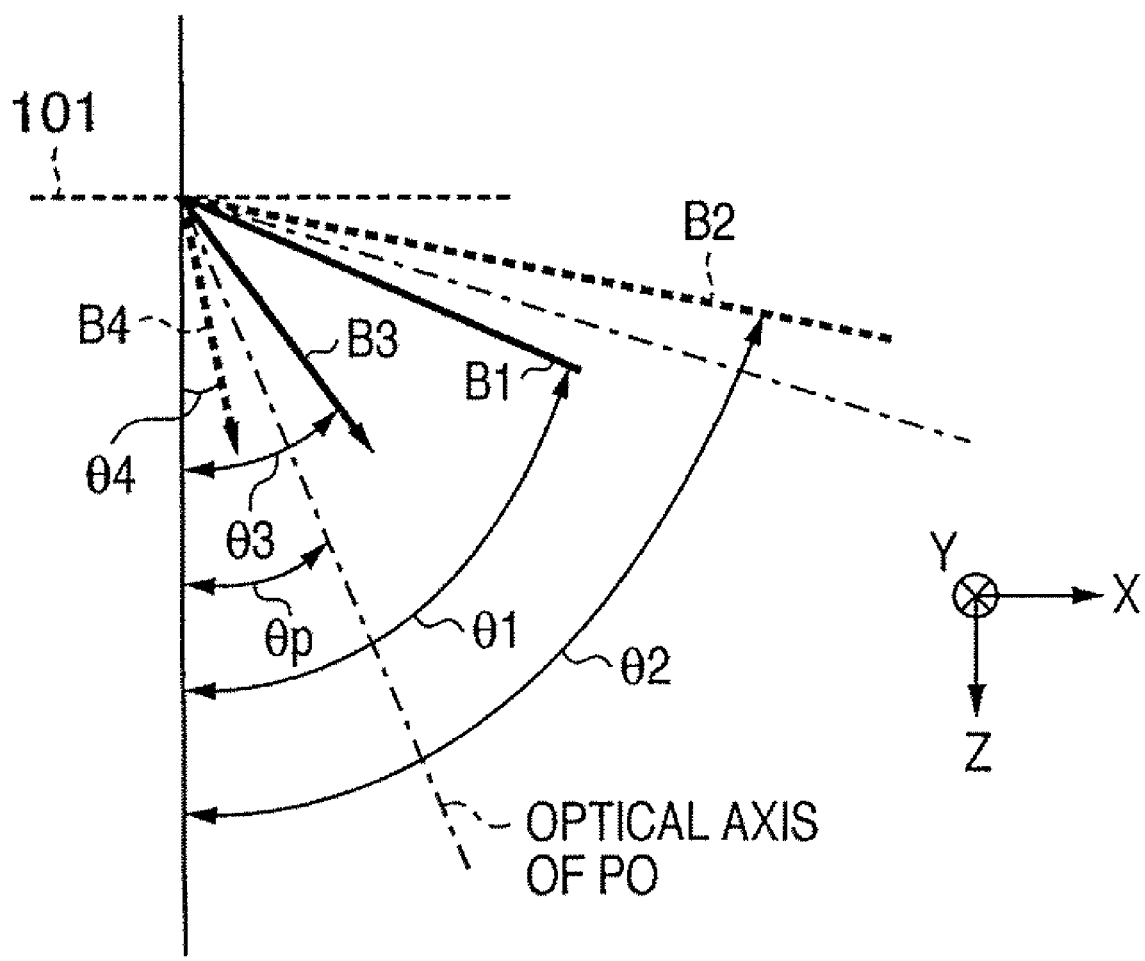
FIG. 18 is a diagram for explaining the relationship between incident light components and diffracted light components with respect to the diffraction grating on the mask according to the third embodiment of the present invention.

As shown in FIG. 17, the diffraction grating pattern 101 has a one-dimensional diffraction grating in which slits are arrayed in the X direction at a pitch P. As shown in FIG. 18, the −1st-order light component B1 and +1st-order light component B2 enter the diffraction grating pattern 101 of the mask 81 via the light projecting imaging optical system (lenses 4 and 108) at incident angles θ1 and θ2, respectively. The diffraction grating pattern 101 diffracts the −1st-order light component B1 and +1st-order light component B2 at diffraction angles θ3 and θ4, respectively.

Let θp be the angle of the optical axis of the projection optical system (PO) 70 with respect to the Z-axis. The angle θp is equal to an incident angle at which (the barycenter of) exposure light enters the mask 81 from the illumination optical system. Then, from the diffraction equation of a diffraction grating, the −1st-order light component B1 and its diffracted light component B3 satisfy:

$$P(\sin(\theta1)+\sin(\theta3))=m\lambda \quad (7)$$

where P is the pitch of the diffraction grating pattern 101 (see FIG. 17), m is the diffraction order, and λ is the wavelength of light emitted by the light source 1. Similarly, the +1st-order light component B2 and its diffracted light component B4 satisfy:

$$P(\sin(\theta2)+\sin(\theta4))=m\lambda \quad (8)$$

As a condition under which the −1st-order light component B1 and +1st-order light component B2 enter the substrate 86 at the same angle with respect to the optical axis of the projection optical system 70, $$|\theta3-\theta p|=|\theta p-\theta4| \quad (9)$$

must hold. Furthermore, as a condition under which the diffracted light components B3 and B4 enter the projection optical system at an angle that falls within its NA, $$|\theta4-\theta3|<[\sin^{-1}(NA\cdot\beta)] \quad (10)$$

must hold, wherein NA is the numerical aperture on the substrate side (image side), and β is the reduction magnification of the projection optical system.

These equations (7) to (10) will be exemplified using typical numerical values.

Consider, for example, a case in which the NA of the projection optical system 70 is 0.3, the incident angle (θp) of EUV light with respect to the mask 81 is 7°, and the central wavelength λ of the light source used in the position detection apparatus 100 is 0.633 μm. Numerical values which satisfy the equations (7) to (10) are set as follows. That is, the pitch of the diffraction grating pattern 101 is P=0.7636 μm, the incident angle of the −1st-order light component B1 with respect to the diffraction grating pattern 101 is 39.6°, and the incident angle of the +1st-order light component B2 with respect to the diffraction grating pattern 101 is 51°. In this case, the incident angles of the diffracted light components B3 and B4 with respect to the surface of the substrate 86 are ±16.3°. Since sin(16.3°)=0.285, the incident angles can fall within the NA of the projection optical system.

As described above, the position detection apparatus 100 according to the third embodiment of the present invention can accurately measure a shift in the surface position of the substrate 86 with respect to an optimal image plane position (imaging plane) of the projection optical system 70 without any influence of reflectance distribution nonuniformity and local tilt of the substrate. When the optimal image plane of the projection optical system 70 serves as a reference surface, it is necessary to calibrate an initial offset D0 of the optical spot interval, as described in the first embodiment.

According to a modification to this embodiment, the optical axis of a position detection apparatus may match that of an exposure light illumination optical system. In this case, the surface position is measured by inserting a mirror or the like in a certain portion of the exposure light illumination optical system. This mirror is removed from the optical path of exposure light in exposure. A polarizing element having a mirror function (reflection function) of directing light to a projection optical system is arranged on a mask instead of using a diffraction grating.

Figure 19:
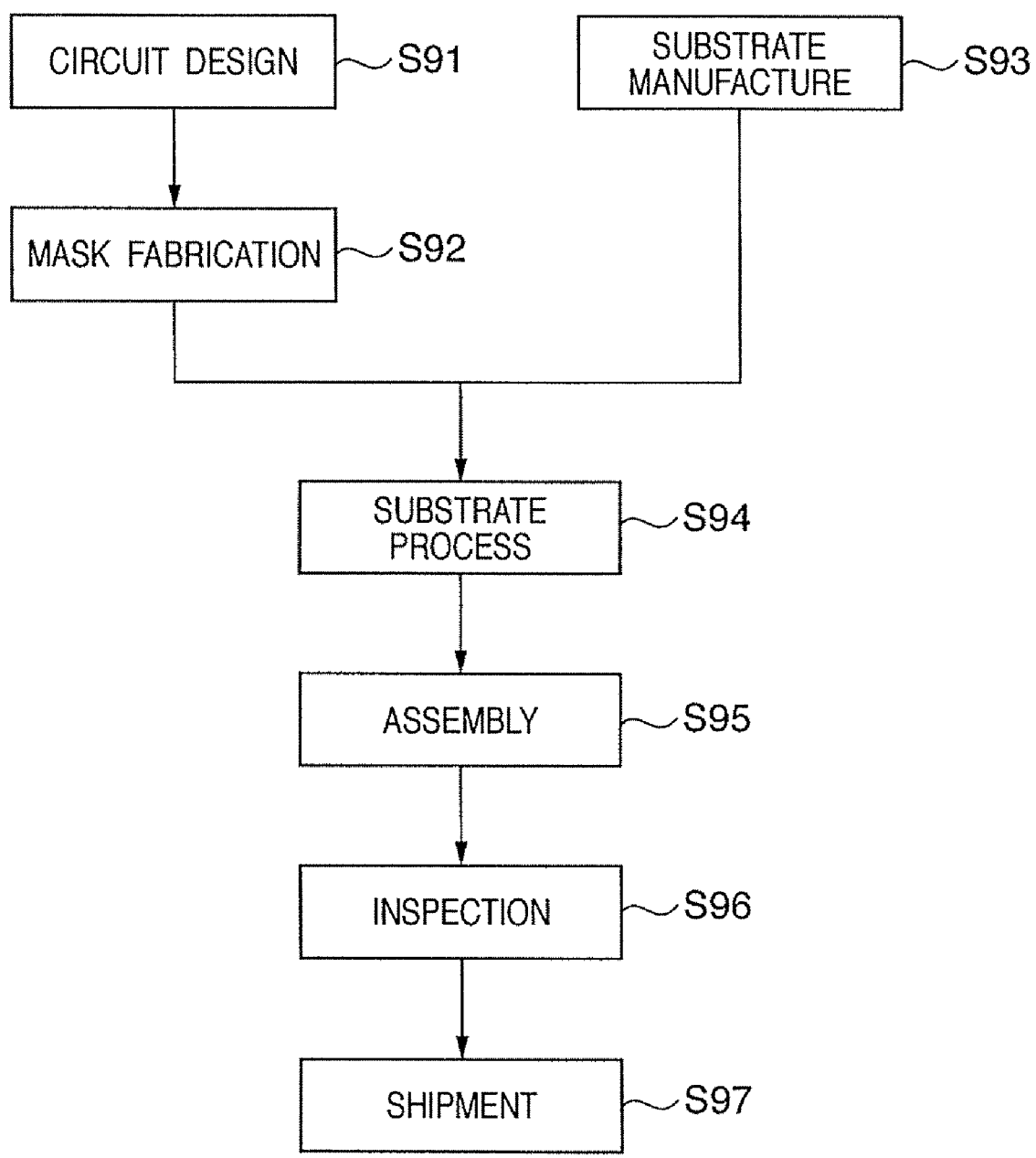
FIG. 19 is a flowchart illustrating the sequence of the overall semiconductor device manufacturing process.
Figure 20:
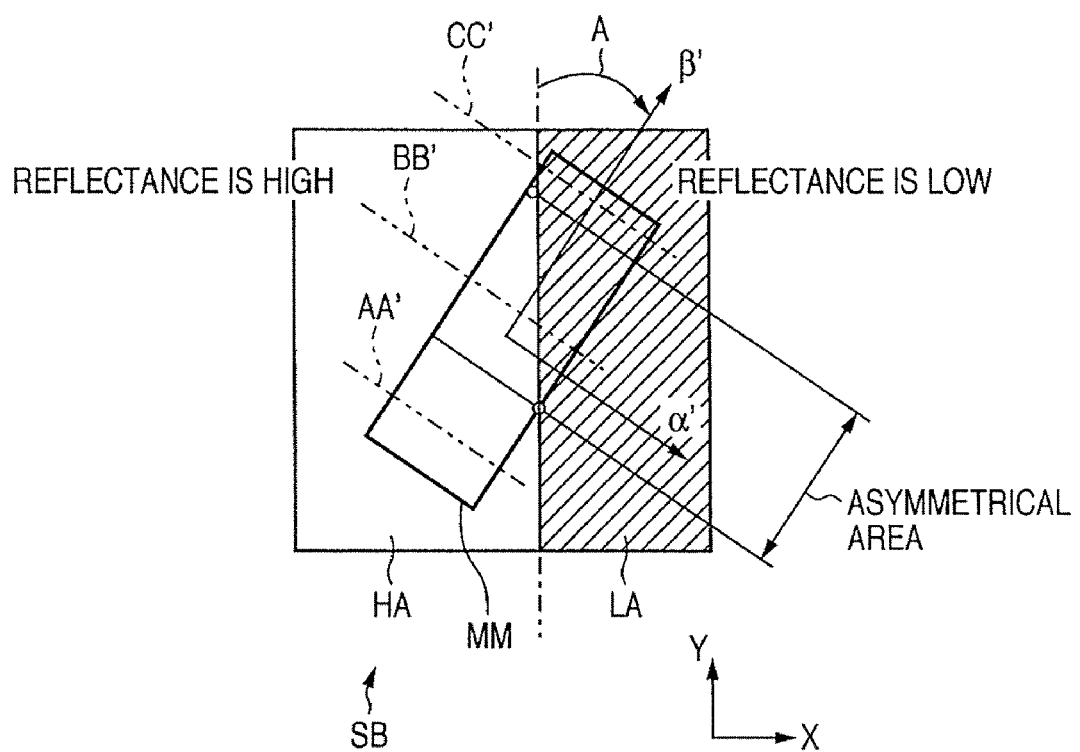
FIG. 20 is a view for explaining a problem of a conventional position detection apparatus.
Figure 21:
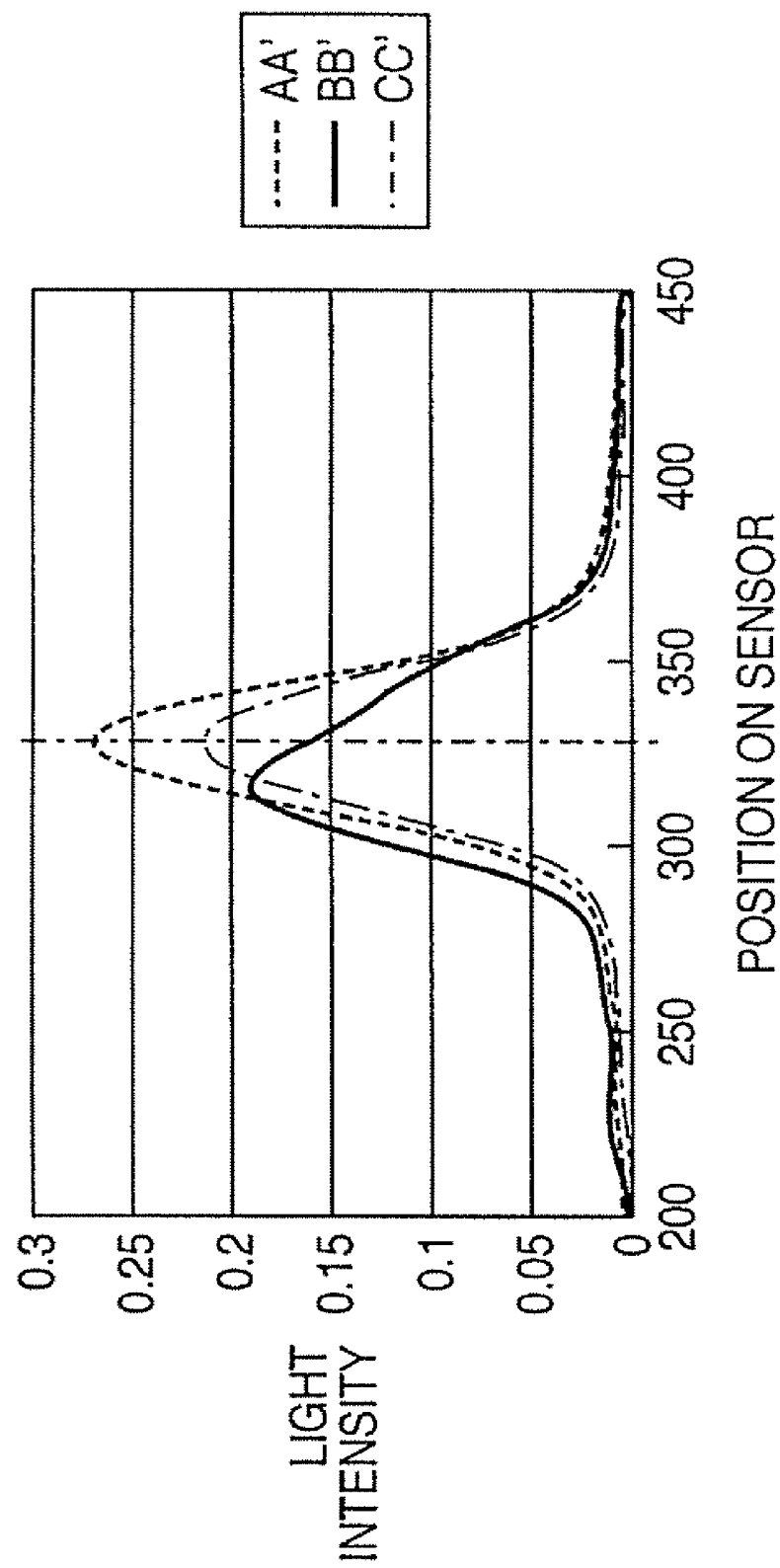
FIG. 21 is a graph showing an example of signal profiles measured by the conventional position detection apparatus.

A semiconductor device manufacturing process using the exposure apparatus according to the present invention will be explained next. FIG. 19 is a flowchart illustrating the sequence of the overall semiconductor device manufacturing process. In step S91 (circuit design), the circuit of a semiconductor device is designed. In step S92 (mask fabrication), a mask (also called a reticle) is fabricated based on the designed circuit pattern. In step S93 (substrate manufacture), a substrate is manufactured using a material such as silicon. In step S94 (substrate process) called a preprocess, the above-described exposure apparatus forms an actual circuit on the substrate by lithography using the mask and substrate. In step S95 (assembly) called a post-process, a semiconductor chip is formed by using the substrate manufactured in step S94. This step includes an assembly step (dicing and bonding) and packaging step (chip encapsulation). In step S96 (inspection), the semiconductor device manufactured in step S95 undergoes inspections such as an operation confirmation test and durability test. After these steps, the semiconductor device is completed and shipped in step S97.

The substrate process in step S94 includes the following steps: an oxidation step of oxidizing the substrate surface; a CVD step of forming an insulating film on the substrate surface; an electrode formation step of forming an electrode on the substrate by vapor deposition; an ion implantation step of implanting ions in the substrate; a resist processing step of applying a photosensitive agent to the substrate; an exposure step of exposing the substrate having undergone the resist processing step, using the above-described exposure apparatus via the mask pattern to form a latent image pattern on the resist; a development step of developing the latent image pattern formed on the resist on the substrate exposed in the exposure step; an etching step of etching portions other than the latent image pattern developed in the development step; and a resist removal step of removing any unnecessary resist remaining after etching. By repeating these steps, a multilayered structure of circuit patterns is formed on the substrate.

Preferred embodiments of the present invention have been described above. However, the present invention is not limited to these embodiments and various changes and modifications can be made within the spirit and scope of the present invention. For example, the present invention is also applicable to an optical pickup surface position detection system (focus detection system).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-002877, filed Jan. 10, 2007, which is hereby incorporated by reference herein in its entirety.

What is claimed is:

1. A position detection apparatus comprising:
   a light projecting optical system which has an optical axis, and which causes two light beams symmetrical about the optical axis to enter a substrate;
   a light receiving optical system which receives the two light beams which have emerged from the light projecting optical system and are reflected by the substrate;
   a light receiving unit which is arranged at a position shifted in an optical axis direction of the light receiving optical system from an imaging plane of the substrate set by the light receiving optical system;
   a detection unit which respectively detects positions of the two light beams which have entered the light receiving unit; and
   a calculator which calculates a surface position of the substrate in a normal direction based on the positions of the two light beams, which are detected by the detection unit,
   wherein at least one of the light projecting optical system and the light receiving optical system is shared for the two light beams.

2. The apparatus according to claim 1, wherein the calculator calculates the surface position of the substrate based on an interval between the respective positions of the two light beams.

3. The apparatus according to claim 1, wherein the light projecting optical system includes
   a pattern plate on which a measurement pattern is formed, and
   a filter which passes the two light beams which are transmitted through the pattern plate, or which are reflected by the pattern plate.

4. An exposure apparatus which exposes a substrate to light via a mask, the apparatus comprising:
   a projection optical system which projects light from the illuminated mask onto the substrate;
   a substrate stage which holds the substrate; and
   a position detection apparatus defined in claim 1, which detects a surface position, in an optical axis direction of the projection optical system, of the substrate held by the substrate stage.

5. The apparatus according to claim 4, wherein the position detection apparatus further detects a position, in a plane perpendicular to the optical axis, of a mark formed on the substrate.

6. The apparatus according to claim 4, further comprising a controller which controls the substrate stage based on the surface position of the substrate, which is detected by the position detection apparatus.

7. The apparatus according to claim 5, further comprising a controller which controls a position of the substrate stage based on the position of the mark, which is detected by the position detection apparatus.

8. The apparatus according to claim 4, wherein the projection optical system includes a reflective optical element, and the position detection apparatus detects the surface position of the substrate via the reflective optical element of the projection optical system.

9. The apparatus according to claim 8, wherein the projection optical system projects extreme ultraviolet light reflected by the mask onto the substrate.

10. A device manufacturing method comprising the steps of:
    exposing a substrate to light using an exposure apparatus defined in claim 4; and
    developing the substrate exposed in the exposing step.

* * * * *